US012598742B2

(12) United States Patent
Hopkins et al.

(10) Patent No.: US 12,598,742 B2
(45) Date of Patent: Apr. 7, 2026

(54) MEMORY ARRAY COMPRISING STRINGS OF MEMORY CELLS AND METHOD USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Alyssa N. Scarbrough, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 438 days.

(21) Appl. No.: 18/144,341

(22) Filed: May 8, 2023

(65) Prior Publication Data

US 2023/0276622 A1     Aug. 31, 2023

Related U.S. Application Data

(62) Division of application No. 17/006,634, filed on Aug. 28, 2020, now Pat. No. 11,683,932.

(51) Int. Cl.
H10B 43/27          (2023.01)
H10B 41/10          (2023.01)
          (Continued)

(52) U.S. Cl.
CPC ............ H10B 41/27 (2023.02); H10B 41/10 (2023.02); H10B 43/10 (2023.02); H10B 43/27 (2023.02)

(58) Field of Classification Search
CPC ................................ H10B 41/27; H10B 43/27
See application file for complete search history.

(56) References Cited

U.S. PATENT DOCUMENTS 10,236,301 B1      3/2019  Howder et al.
2010/0109072 A1    5/2010  Kidoh et al.
                   (Continued)

FOREIGN PATENT DOCUMENTS

KR     10-2010-0066783         6/2010

OTHER PUBLICATIONS

WO PCT/US2021/045590 IPRP, Feb. 28, 2023, Micron Technology, Inc.

(Continued)

*Primary Examiner* — Christopher A Johnson
(74) *Attorney, Agent, or Firm* — Wells St. John P.S.

(57) ABSTRACT

A method used in forming a memory array comprising strings of memory cells comprises forming a stack comprising vertically-alternating first tiers and second tiers. The stack comprises laterally-spaced memory-block regions that have horizontally-elongated trenches there-between. Channel openings extend through the first tiers and the second tiers in the memory-block regions. Channel material of channel-material strings is formed in the channel openings and the channel material is formed in the horizontally-elongated trenches. The channel material is removed from the horizontally-elongated trenches and the channel material of the channel-material strings is left in the channel openings. After removing the channel material from the horizontally-elongated trenches, intervening material is formed in the horizontally-elongated trenches laterally-between and longitudinally-along immediately-laterally-adjacent of the memory-block regions. Other embodiments, including structure independent of method, are disclosed.

13 Claims, 24 Drawing Sheets

(51) Int. Cl.
    *H10B 41/27*     (2023.01)
    *H10B 43/10*     (2023.01)

(56)                  References Cited

U.S. PATENT DOCUMENTS

| | | |
|---|---|---|
| 2010/0140685 A1 | 6/2010 | Kang et al. |
| 2011/0159645 A1 | 6/2011 | Pekny |
| 2015/0380418 A1 | 12/2015 | Zhang et al. |
| 2017/0179026 A1 | 6/2017 | Toyama et al. |
| 2018/0277567 A1 | 9/2018 | Nakamura et al. |
| 2019/0088671 A1 | 3/2019 | Greenlee et al. |
| 2020/0091186 A1* | 3/2020 | Yang ...................... H10B 43/35 |
| 2020/0126974 A1* | 4/2020 | Liu ...................... H10D 62/292 |
| 2020/0312868 A1 | 10/2020 | Xiao |
| 2020/0395381 A1 | 12/2020 | Yang et al. |
| 2020/0402992 A1 | 12/2020 | Otsu et al. |
| 2021/0384209 A1 | 12/2021 | Heo |
| 2022/0068944 A1 | 3/2022 | Hopkins et al. |
| 2022/0068959 A1 | 3/2022 | Billingsley et al. |
| 2022/0246628 A1 | 8/2022 | Scarbrough et al. |

OTHER PUBLICATIONS

WO PCT/US2021/045590 Search Rep., Dec. 7, 2021, Micron Technology, Inc.
WO PCT/US2021/045590 Writt. Opin., Dec. 7, 2021, Micron Technology, Inc.

* cited by examiner

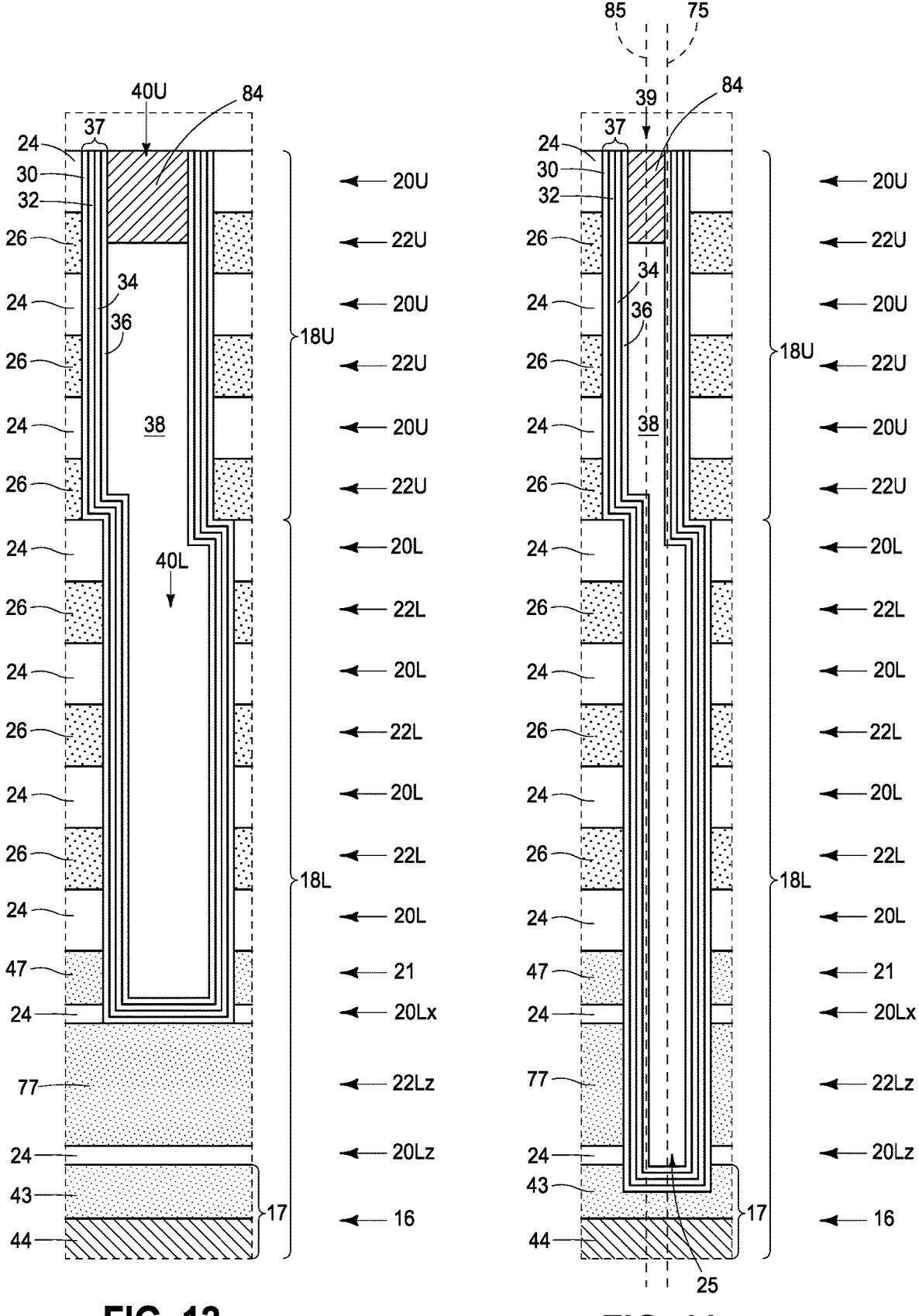
FIG. 12    FIG. 11

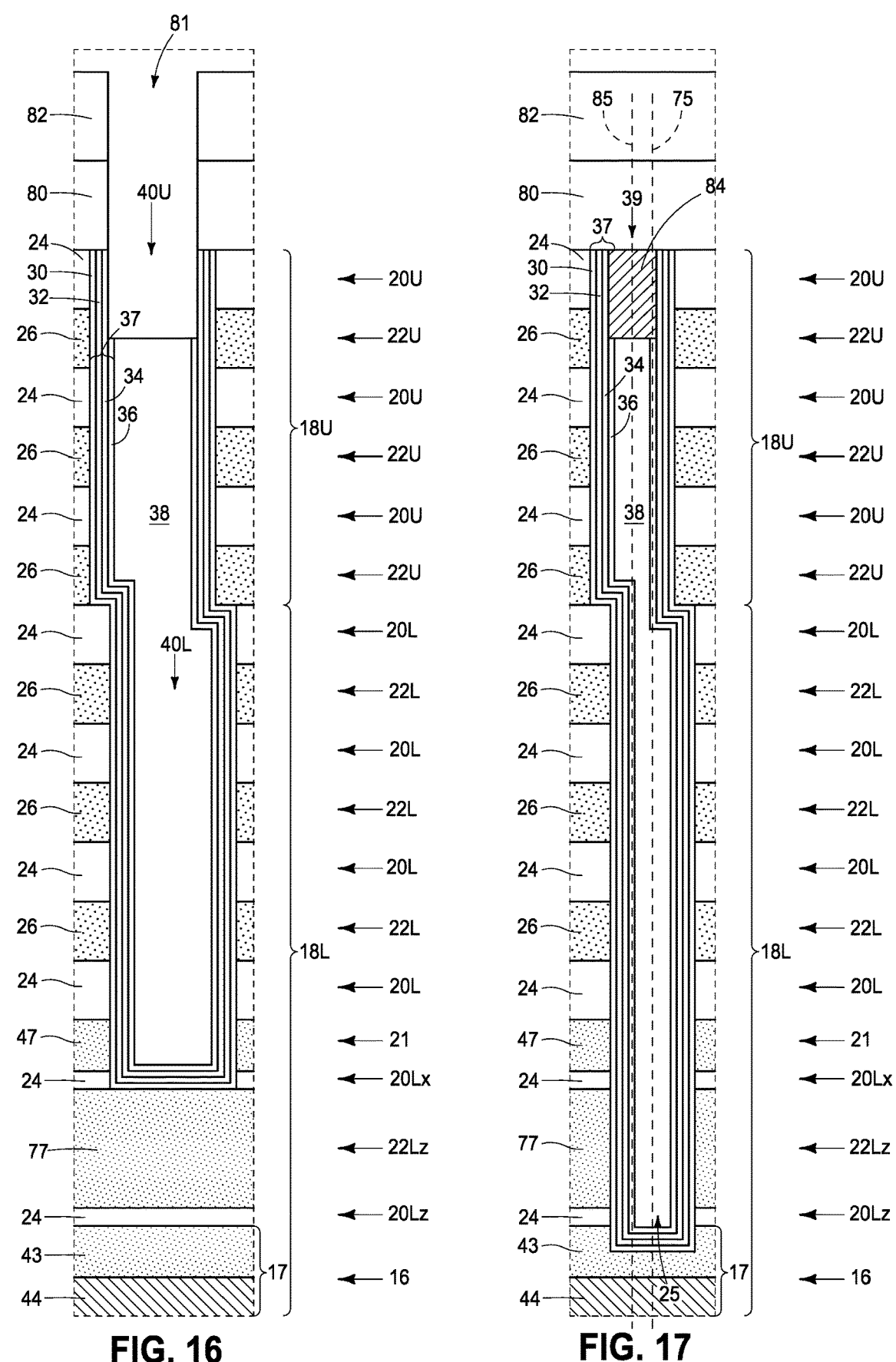
FIG. 16          FIG. 17

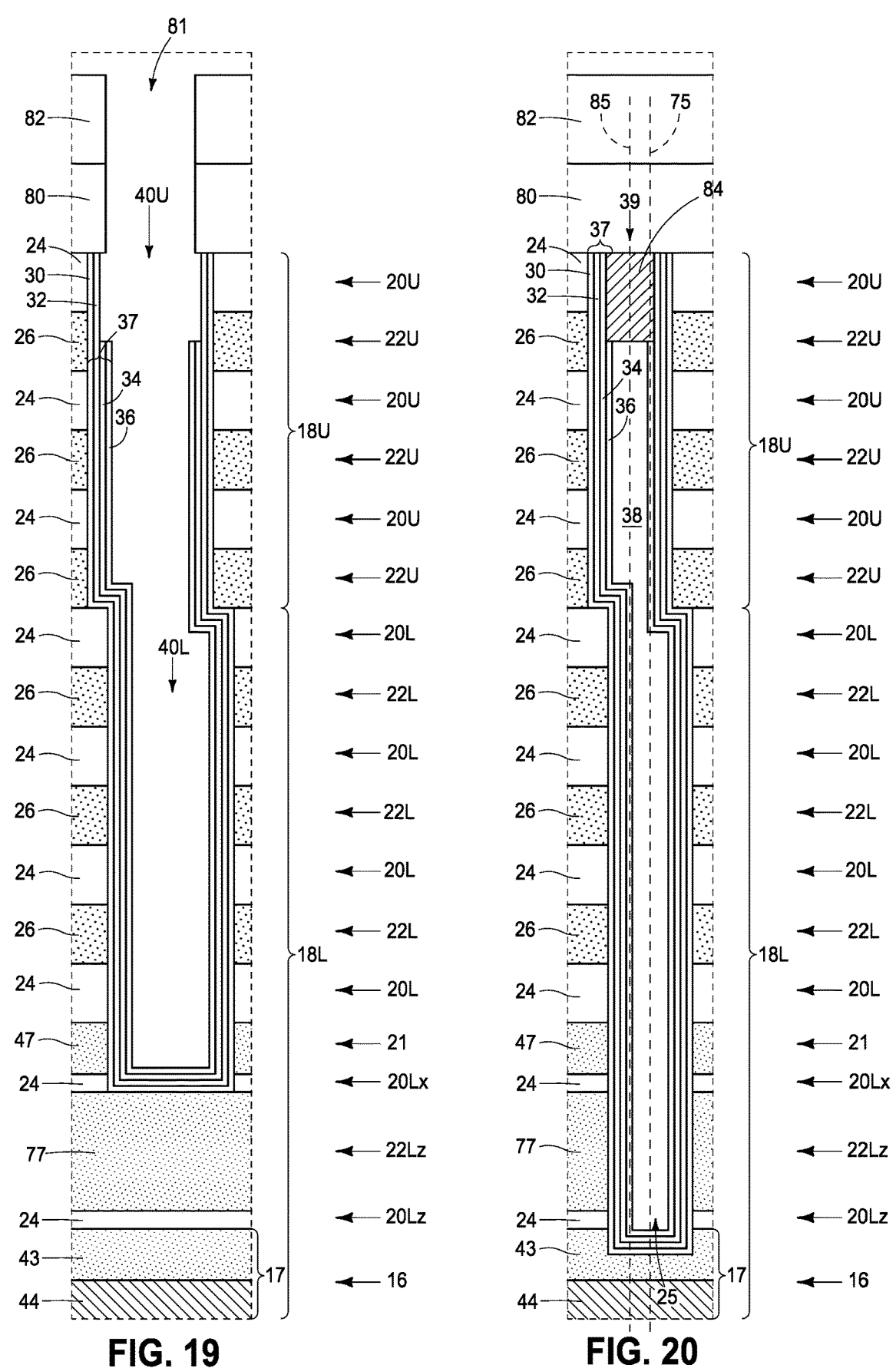
FIG. 19          FIG. 20

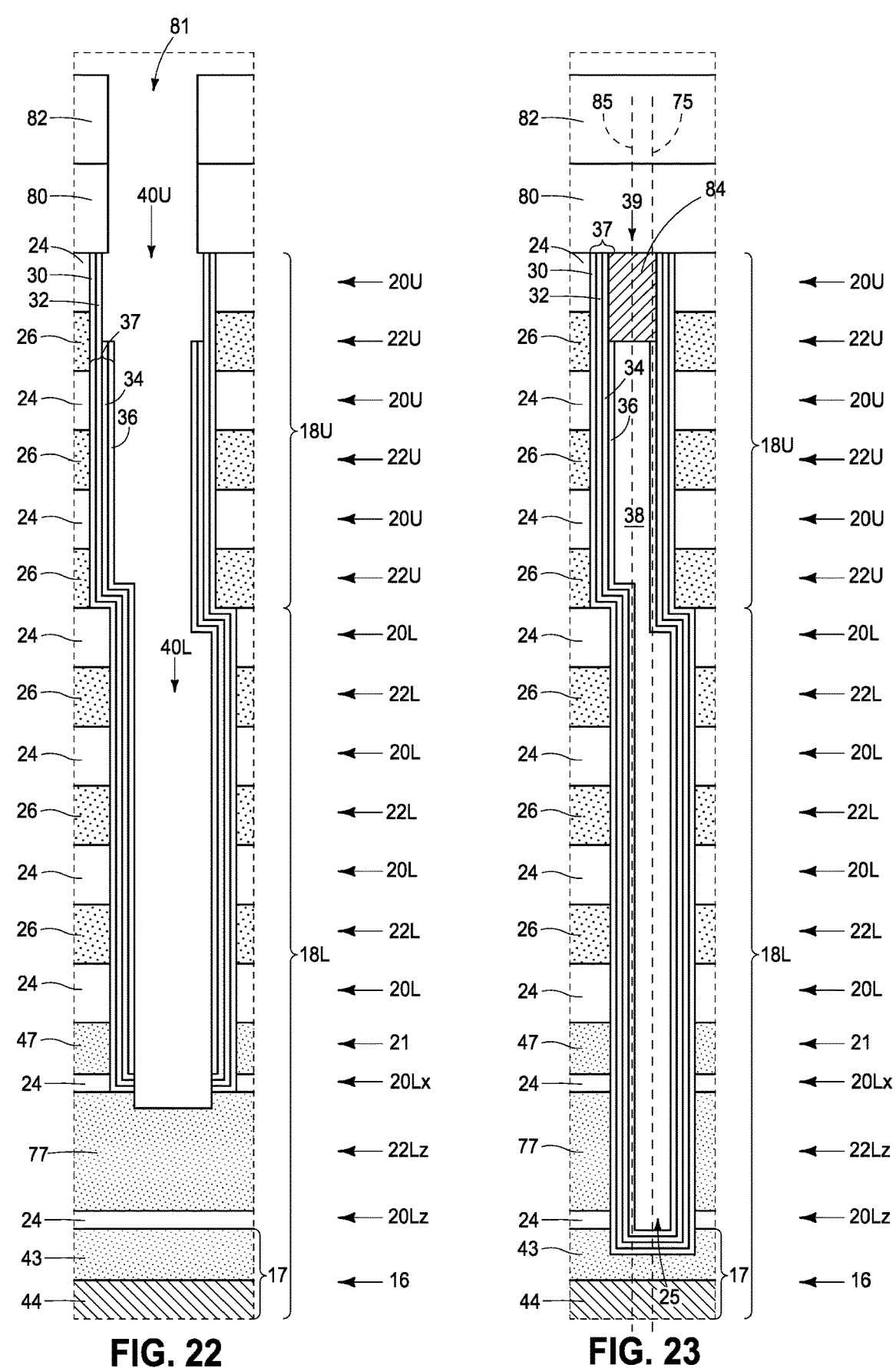
FIG. 22     FIG. 23

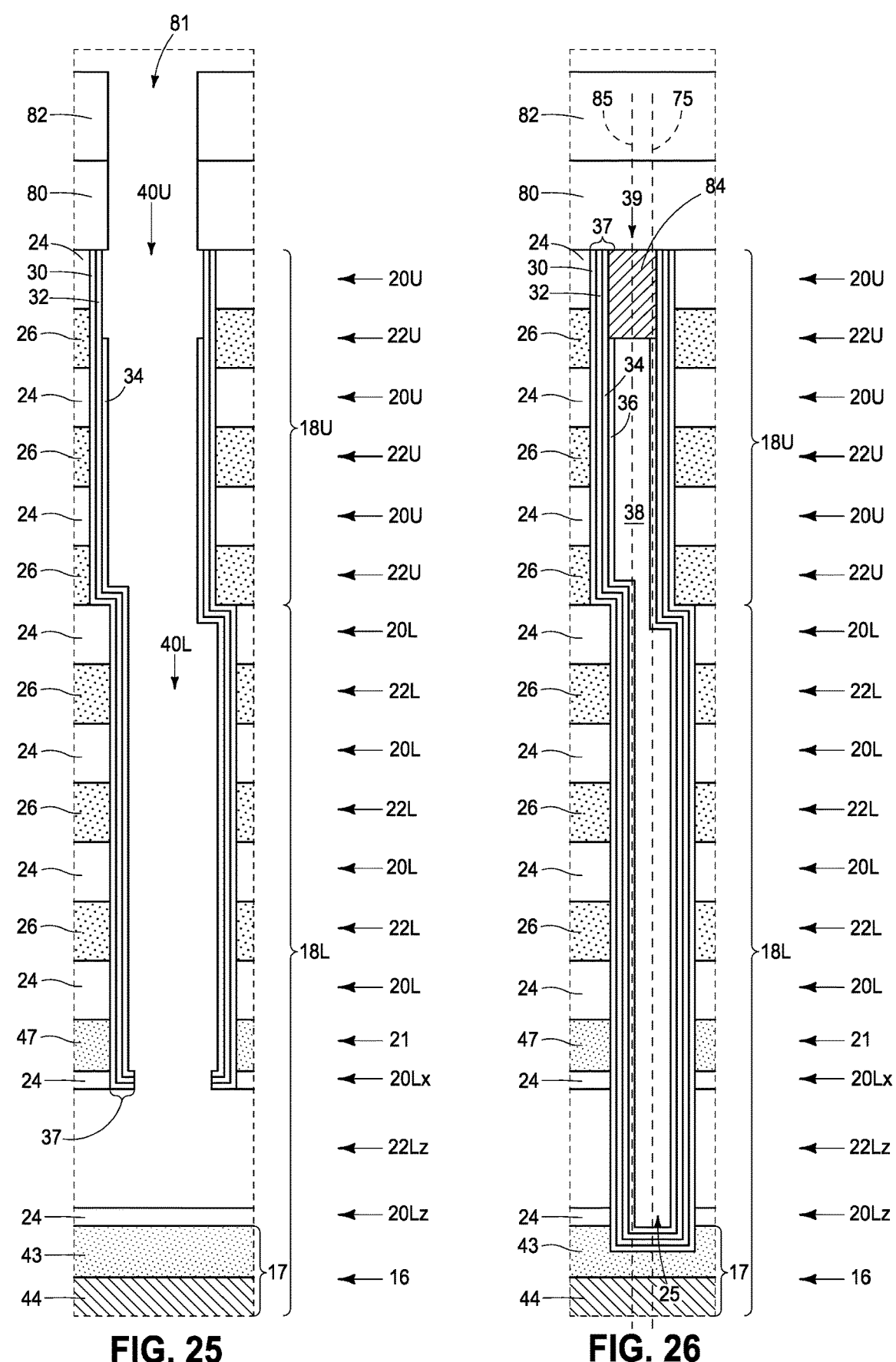
FIG. 25          FIG. 26

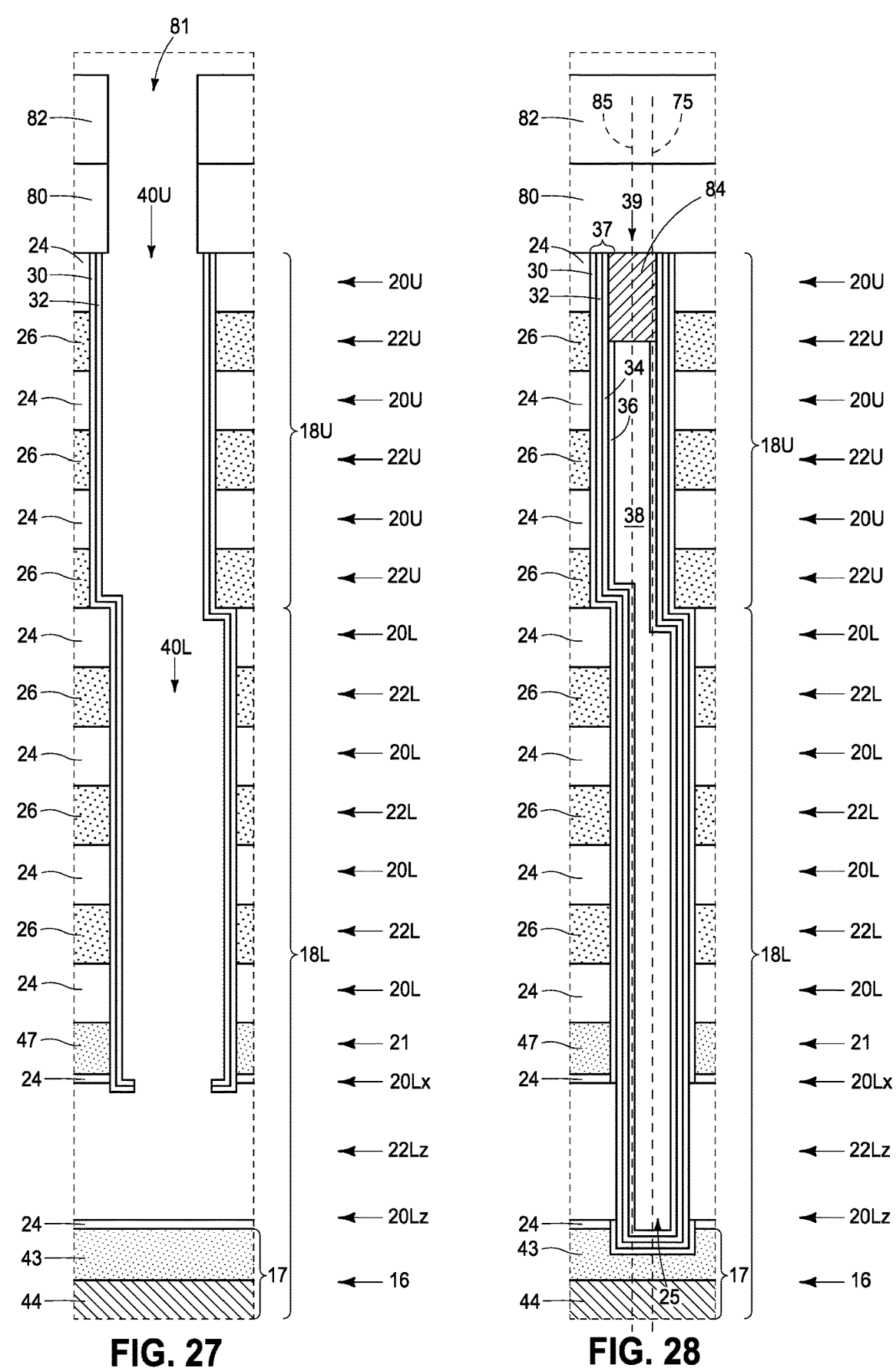
FIG. 27    FIG. 28

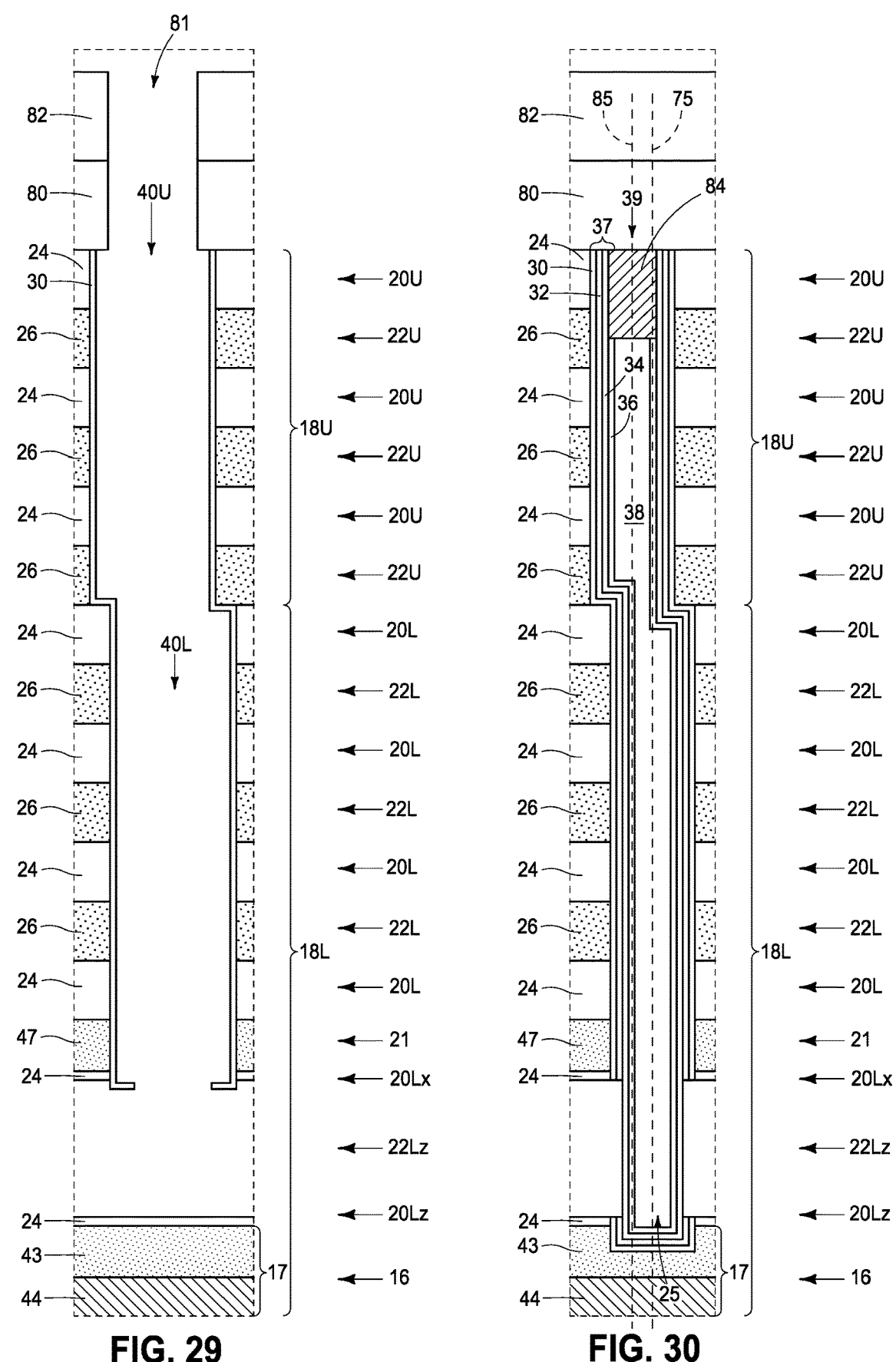
FIG. 29          FIG. 30

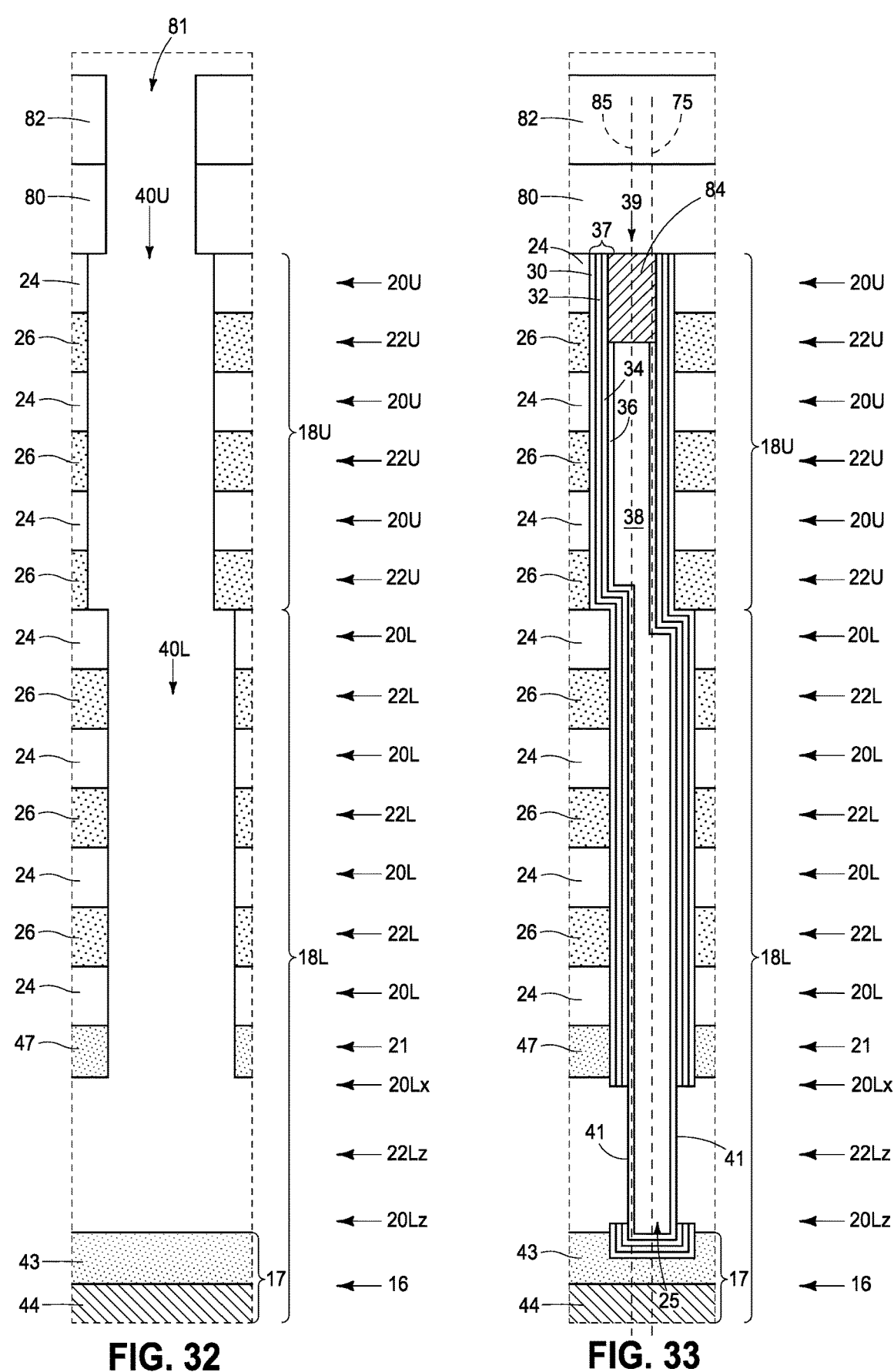
FIG. 32          FIG. 33

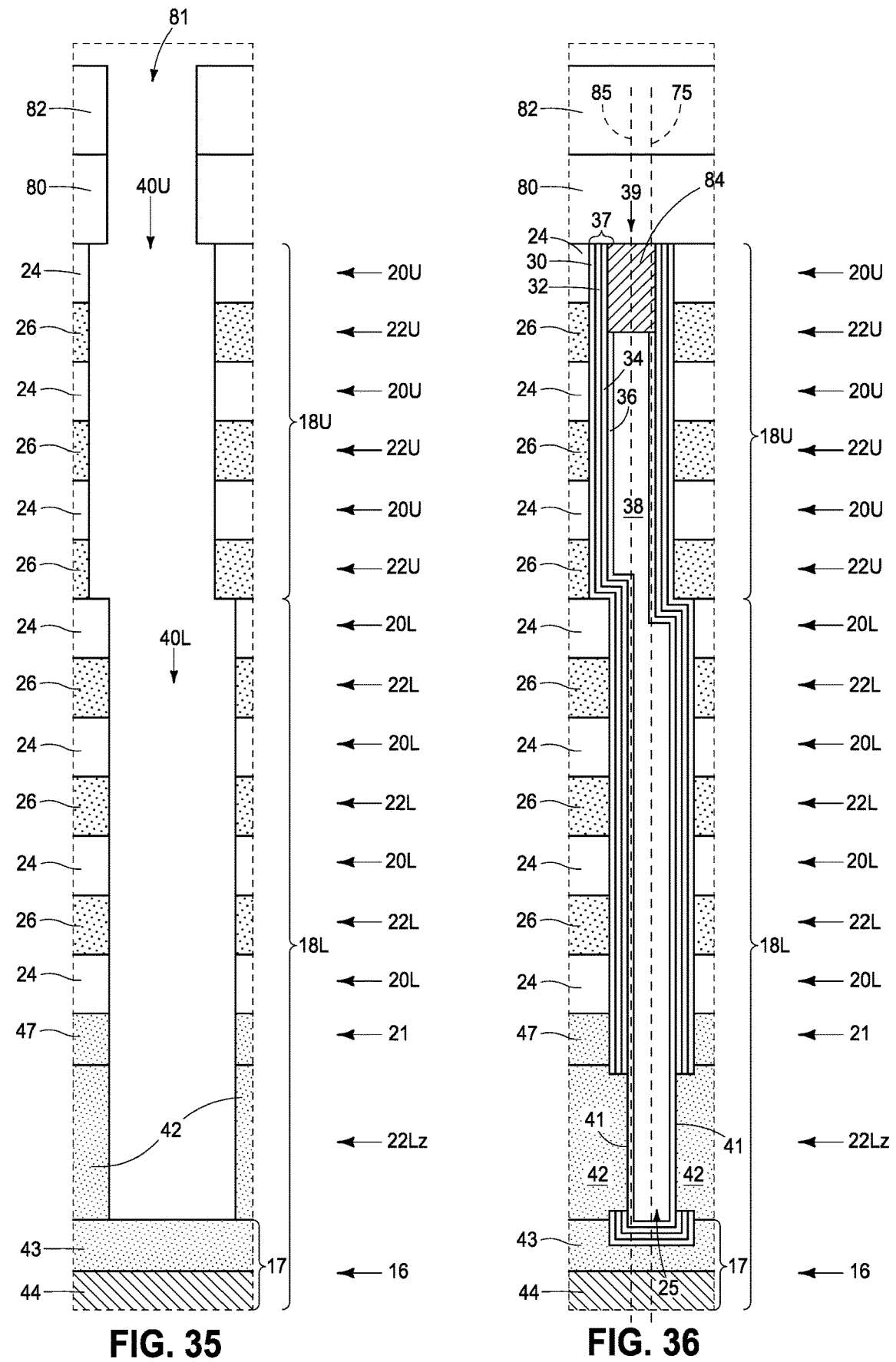
FIG. 35          FIG. 36

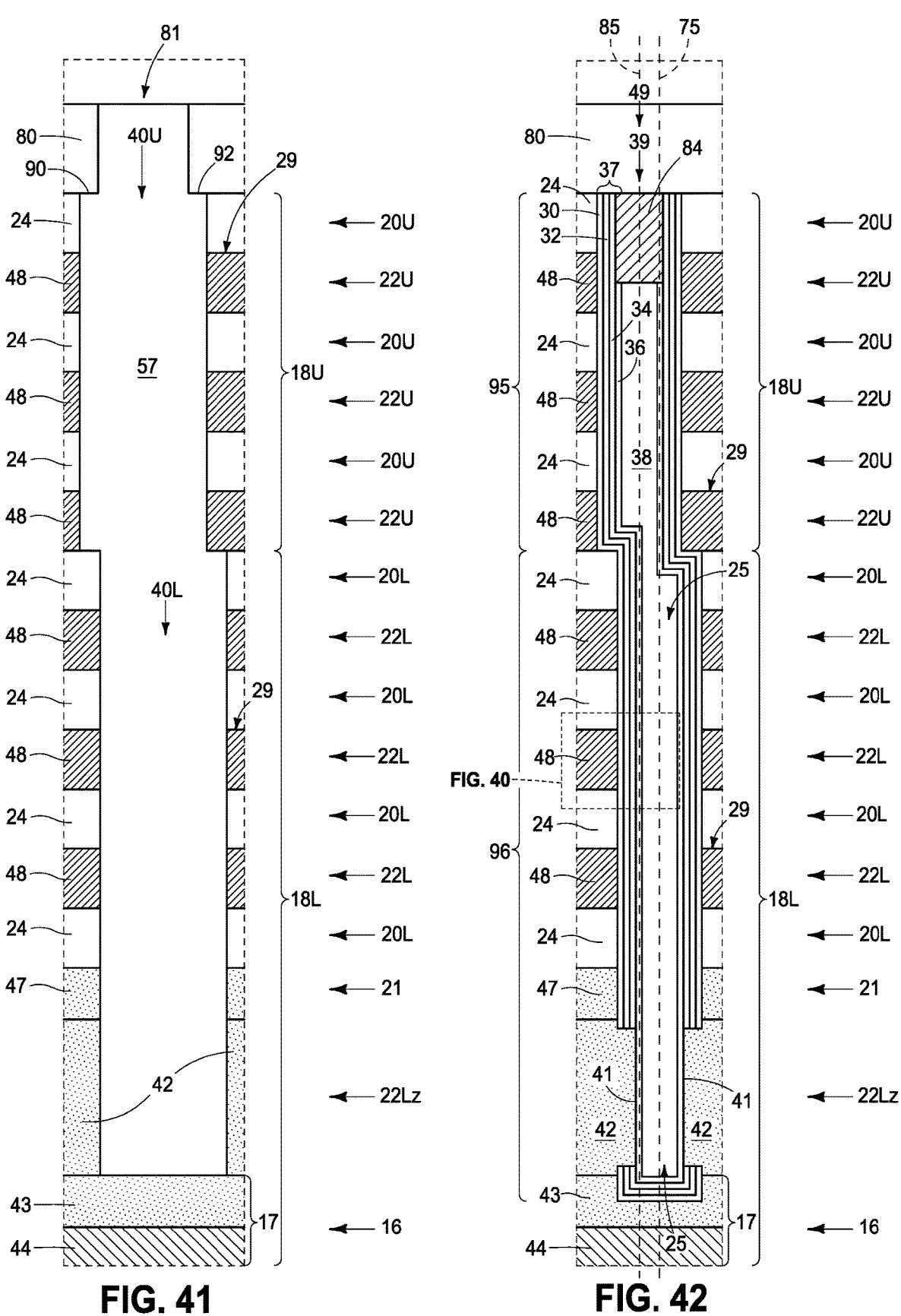
FIG. 41          FIG. 42

MEMORY ARRAY COMPRISING STRINGS OF MEMORY CELLS AND METHOD USED IN FORMING A MEMORY ARRAY COMPRISING STRINGS OF MEMORY CELLS

RELATED PATENT DATA

This patent resulted from a divisional application of U.S. patent application Ser. No. 17/006,634, filed Aug. 28, 2020, entitled "Memory Array Comprising Strings Of Memory Cells And Method Used In Forming A Memory Array Comprising Strings Of Memory Cells", naming John D. Hopkins and Alyssa N. Scarbrough as inventors, the disclosure of which is incorporated by reference.

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 3-42 are diagrammatic sequential sectional, expanded, enlarged, and/or partial views of the construction of FIGS. 1 and 2, or portions thereof, in process in accordance with some embodiments of the invention.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-42 which may be considered as a "gate-last" or "replacement-gate" process, and starting with FIGS. 1 and 2.

Figure 1:
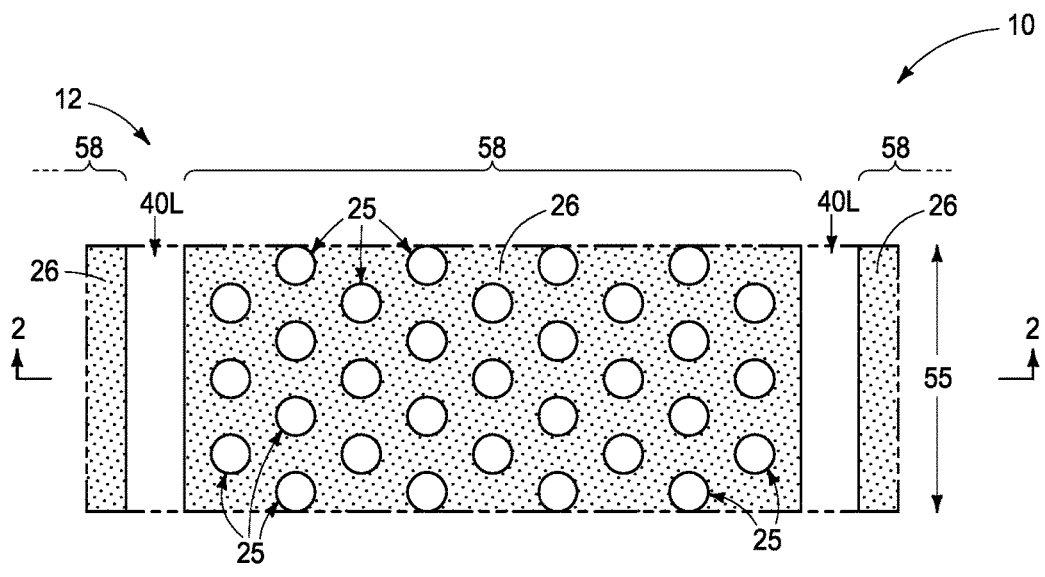
FIG. 1 is a diagrammatic cross-sectional view of a portion of a substrate in process in accordance with an embodiment of the invention and is taken through line 1-1 in FIG. 2.
Figure 2:
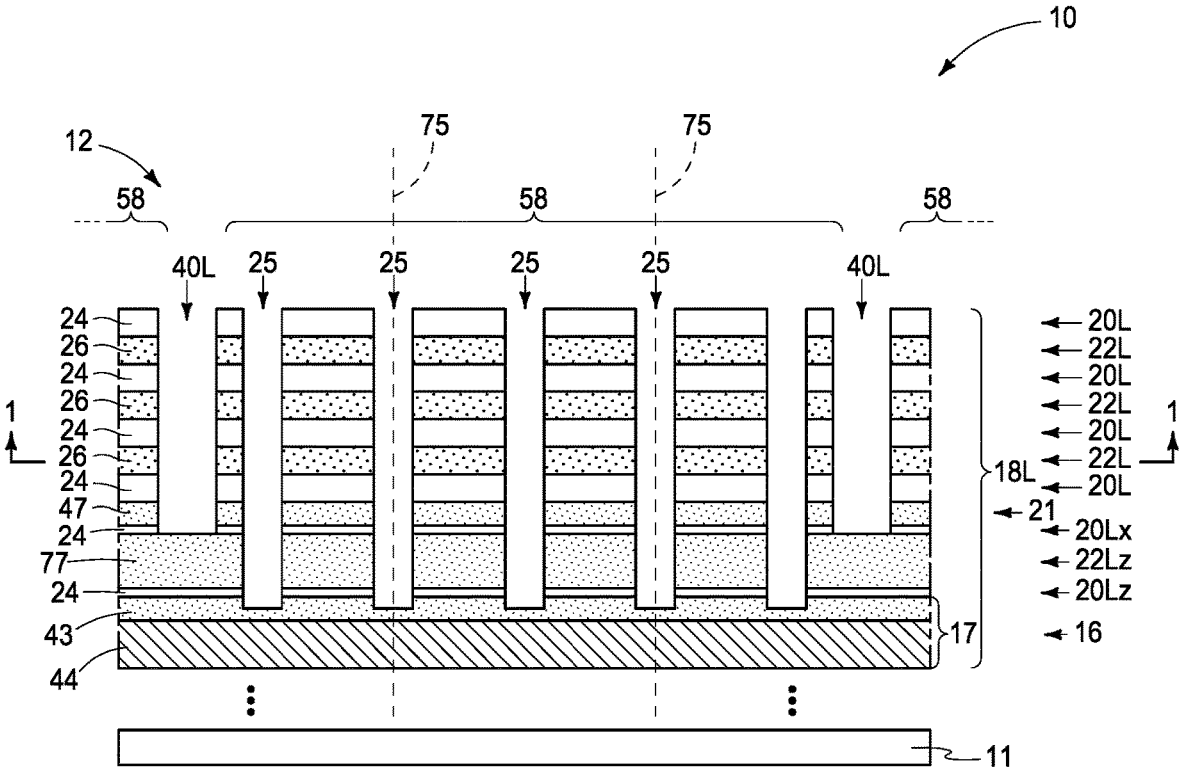
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/ semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

In some embodiments and as shown, a conductor tier 16 comprising conductor material 17 has been formed above substrate 11. As an example, conductor material 17 comprises upper conductor material 43 (e.g., n-type or p-type conductively-doped polysilicon) directly above (e.g., directly against) lower conductor material 44 (e.g., WSi$_x$) of different composition from upper conductor material 43. Conductor tier 16 may comprise part of control circuitry (e.g., peripheral-under-array circuitry and/or a common source line or plate) used to control read and write access to the transistors and/or memory cells that will be formed within array 12.

In some embodiments, conductor tier 16 is part of a lower stack 18L comprising vertically-alternating lower insulative tiers 20L and lower conductive tiers 22L. Example thickness for each of lower tiers 20L and 22L is 22 to 60 nanometers. Only a small number of lower tiers 20L and 22L is shown, with more likely lower stack 18L comprising dozens, a hundred or more, etc. of lower tiers 20L and 22L. Other circuitry that may or may not be part of peripheral and/or control circuitry may be between conductor tier 16 and lower stack 18L. For example, multiple vertically-alternating tiers of conductive material and insulative material of such circuitry may be below a lowest of lower conductive tiers 22L and/or above an uppermost of lower conductive tiers 22L. For example, one or more select gate tiers (not shown) or dummy tiers (not shown) may be between conductor tier 16 and the lowest conductive tier 22L and one or more select gate tiers (not shown) or dummy tiers (not shown) may be above an uppermost of lower conductive tiers 22L. Alternately or additionally, at least one of the depicted lowest conductive tiers 22L may be a select gate tier. Regardless, lower conductive tiers 22L (alternately referred to as lower first tiers) may not comprise conducting material and lower insulative tiers 20L (alternately referred to as lower second tiers) may not comprise insulative material or be insulative at this point in processing in conjunction with the hereby initially-described example method embodiment which is "gate-last" or "replacement-gate". Example lower conductive tiers 22L comprise first material 26 (e.g., silicon nitride) which may be wholly or partially sacrificial. Example lower insulative tiers 20L comprise second material 24 (e.g., silicon dioxide) that is of different composition from that of first material 26 and which may be wholly or partially sacrificial.

In one embodiment and as shown, a lowest lower second tier 20Lz of lower stack 18L is directly above (e.g., directly against) conductor material 17. Tier 20Lz may be sacrificial. A lowest lower first tier 22Lz of lower stack 18L is directly above (e.g., directly against) tier 20Lz and comprises sacrificial material 77. Example sacrificial materials 77 include silicon nitride and doped or undoped polysilicon. In this document, "undoped polysilicon" is polysilicon having from 0 atoms/cm$^3$ to $1 \times 10^{12}$ atoms/cm$^3$ of atoms of conductivity-increasing impurity. "Doped polysilicon" is polysilicon that has more than $1 \times 10^{12}$ atoms/cm$^3$ of atoms of conductivity-increasing impurity and "conductively-doped polysilicon" is polysilicon that has at least $1 \times 10^{18}$ atoms/cm$^3$ of atoms of conductivity-increasing impurity. In one embodiment, a next-lowest lower second tier 20Lx is directly above tier 20Lz and a conducting-material tier 21 comprising conducting material 47 (e.g., conductively-doped polysilicon) is directly above tier 20Lx.

Lower channel openings 25 have been formed (e.g., by etching) through lower insulative tiers 20L, 20Lx, 20Lz and lower conductive tiers 22L, 22Lz to conductor tier 16. Lower channel openings 25 may taper radially-inward (not shown) moving deeper into lower stack 18L. In some embodiments, lower channel openings 25 may go into conductor material 17 of conductor tier 16 as shown or may stop there-atop (not shown). Alternately, as an example, lower channel openings 25 may stop atop or within the lowest lower insulative tier 20Lz. A reason for extending lower channel openings 25 at least to conductor material 17 of conductor tier 16 is to provide an anchoring effect to material that is within lower channel openings 25. Etch-stop material (not shown) may be within or atop conductor material 17 of conductor tier 16 to facilitate stopping of the etching of lower channel openings 25 relative to conductor tier 16 when such is desired. Such etch-stop material may be sacrificial or non-sacrificial. Regardless, lower channel openings 25 may be considered as having an average longitudinal axis 75 (e.g., average if axis 75 is not perfectly straight) that in one embodiment is vertical.

Horizontally-elongated lower trenches 40L have been formed (e.g., by anisotropic etching) into lower stack 18L to form laterally-spaced memory-block regions 58. By way of example and for brevity only, lower channel openings 25 are shown as being arranged in groups or columns of staggered rows of four and five lower channel openings 25 per row and being arrayed in laterally-spaced memory-block regions 58 that will comprise laterally-spaced memory blocks 58 in a finished circuitry construction. In this document, "block" is generic to include "sub-block". Lower trenches 40L will typically be wider than lower channel openings 25 (e.g., 10 to 20 times wider, yet such wider degree not being shown for brevity). Memory-block regions 58 and resultant memory blocks 58 (not yet shown) may be considered as being longitudinally elongated and oriented, for example along a direction 55. Any alternate existing or future-developed arrangement and construction may be used.

Trenches 40L as shown have been formed to extend to sacrificial material 77 in lowest first tier 22Lz. As one example, trenches 40L may initially be formed by etching materials 22, 24, and 47 (likely using different anisotropic etching chemistries) and that stops on or within material 24 of next-lowest lower second tier 20Lx (when present), followed by punch-etching thereof. Alternately, and by way of example only, a sacrificial etch-stop line (not shown) having the same general horizontal outline as trenches 40L may individually be formed in conducting-material tier 21 (when present) directly above and in contact with material 24 of next-lowest lower second tier 20Lx before forming tiers 20L and 22L there-above. Trenches 40L may then be formed by etching materials 24 and 26 to stop on or within the material of the individual sacrificial lines, followed by exhuming remaining material of such lines. Analogously, sacrificial etch-stop plugs (not shown) may be formed in one or more of tiers 20Lz, 22Lz, and 20Lx in horizontal locations where lower channel openings 25 will be prior to forming tiers 21, 20L, and 22L there-above and used analogously to the sacrificial etch-stop lines described above in forming trenches 40L. Regardless, and in one embodiment, a method in accordance with the invention comprises simultaneously forming (c) and (d), where, (c): horizontally-elongated lower trenches 40L into lower stack 18L laterally-between immediately-laterally-adjacent memory-block regions 58; and (d): lower channel openings 25 into lower stack 18L laterally-between horizontally-elongated lower trenches 40L.

Figure 3:
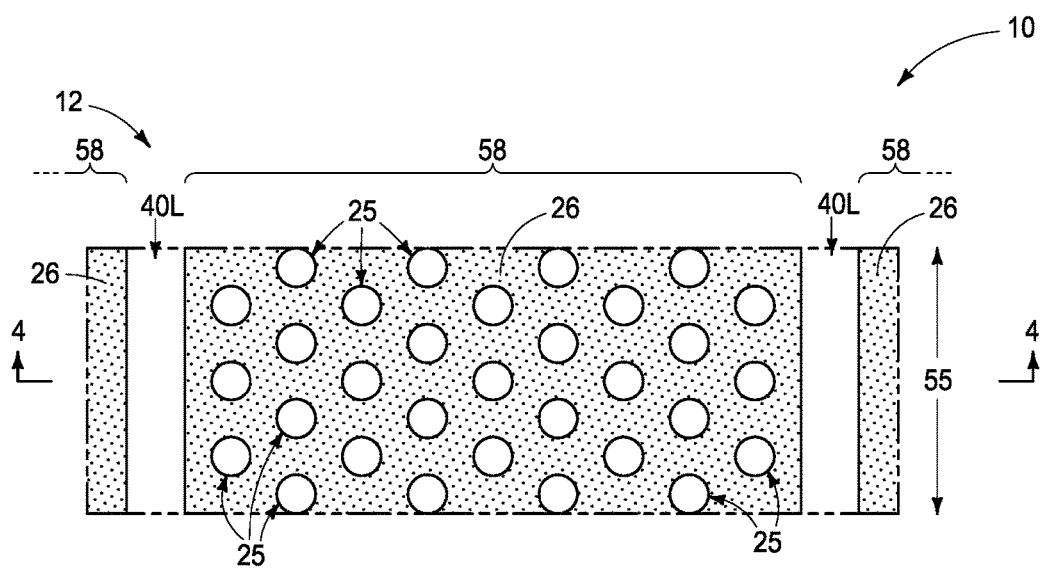
Figure 4:
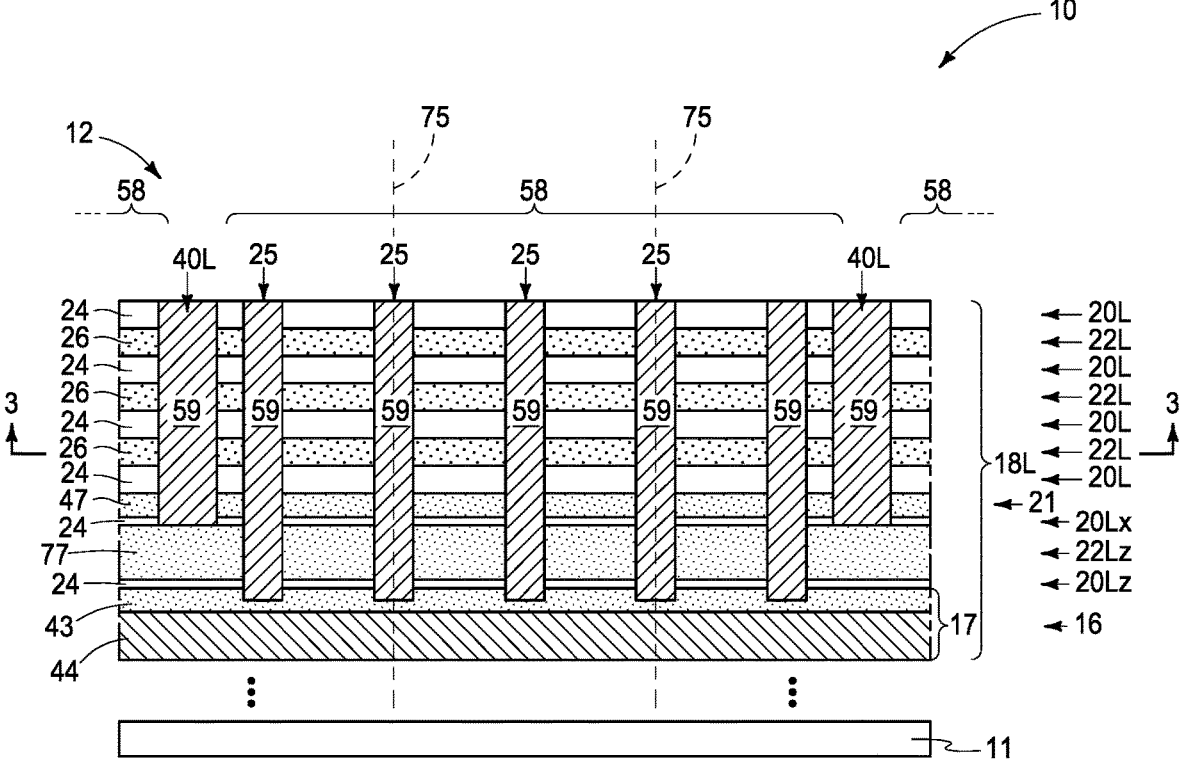

Referring to FIGS. 3 and 4, sacrificial material 59 (e.g., elemental tungsten) has been formed in lower channel openings 25 and in lower trenches 40L.

Figure 5:
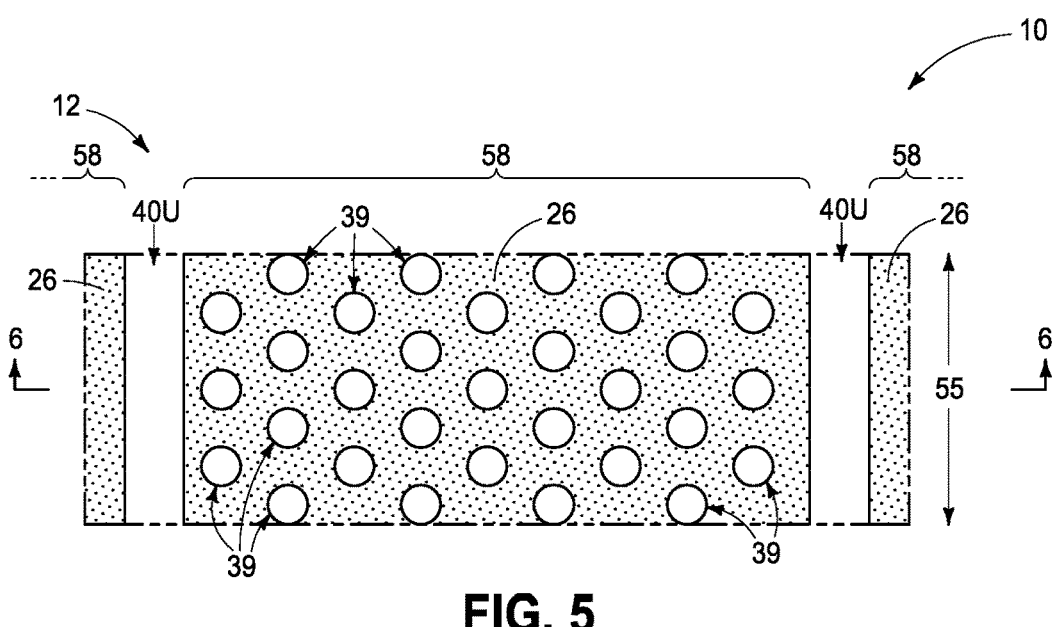
Figure 6:
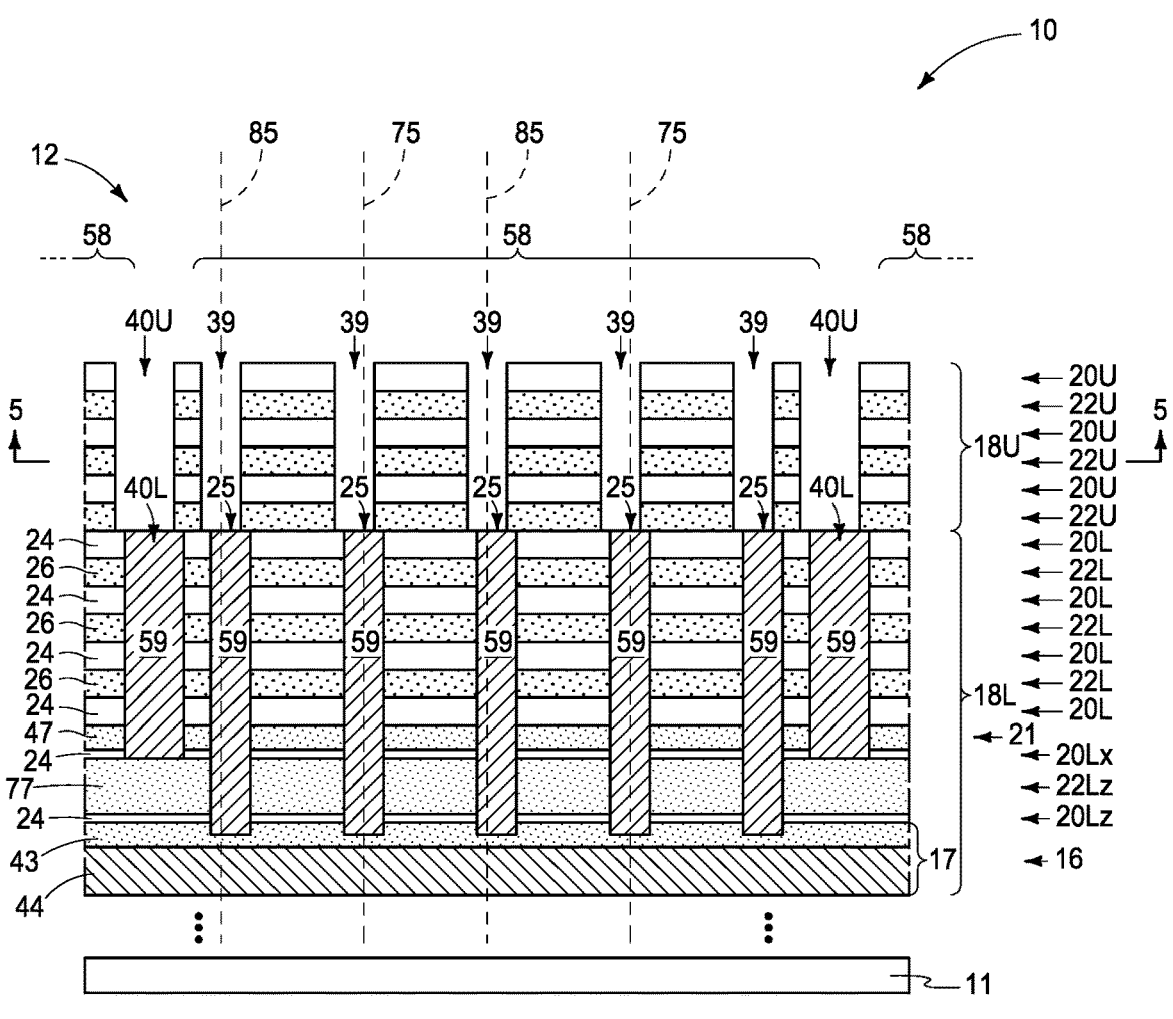
Figure 7:
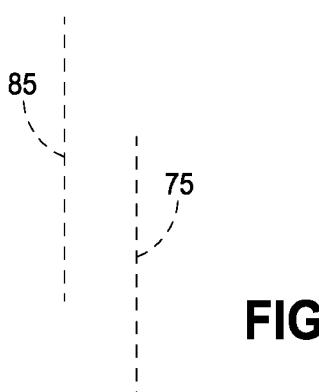

Referring to FIGS. 5-7, an upper stack 18U comprising vertically-alternating upper insulative tiers 20U (alternately referred to as upper second tiers) and upper conductive tiers 22U (alternately referred to as upper first tiers) has been formed directly above lower stack 18L, with upper and lower stacks 18U and 18L collectively comprising memory-block regions 58. Upper insulative tiers 20U and upper conductive tiers 22U may have any of the attributes described above with respect to lower insulative tiers 20L and lower conductive tiers 22L. Example upper insulative tiers 20U are shown as comprising second material 24 and upper conductive tiers 22U are shown as comprising first material 26, although other compositions may of course be used and not necessarily of the same composition as in lower stack 18L.

Still referring to FIGS. 5-7, and in one embodiment, (a) and (b) have been simultaneously formed (e.g., by etching), where, (a): horizontally-elongated upper trenches 40U into upper stack 18U laterally-between immediately-laterally-adjacent memory-block regions 58; and (b): upper channel openings 39 into upper stack 18U laterally-between horizontally-elongated upper trenches 40U.

In one embodiment and as shown, and as may be best perceived with reference to FIG. 7, individual upper channel openings 39 are formed to have an average longitudinal axis 85 that is laterally offset relative to lower-portion average longitudinal axis 75 in a vertical cross-section (e.g. that of FIG. 6) where upper channel openings 39 and lower channel openings 25 join. In one embodiment and as shown, average longitudinal axis 75 and average longitudinal axis 85 are parallel relative to one another.

Figure 8:
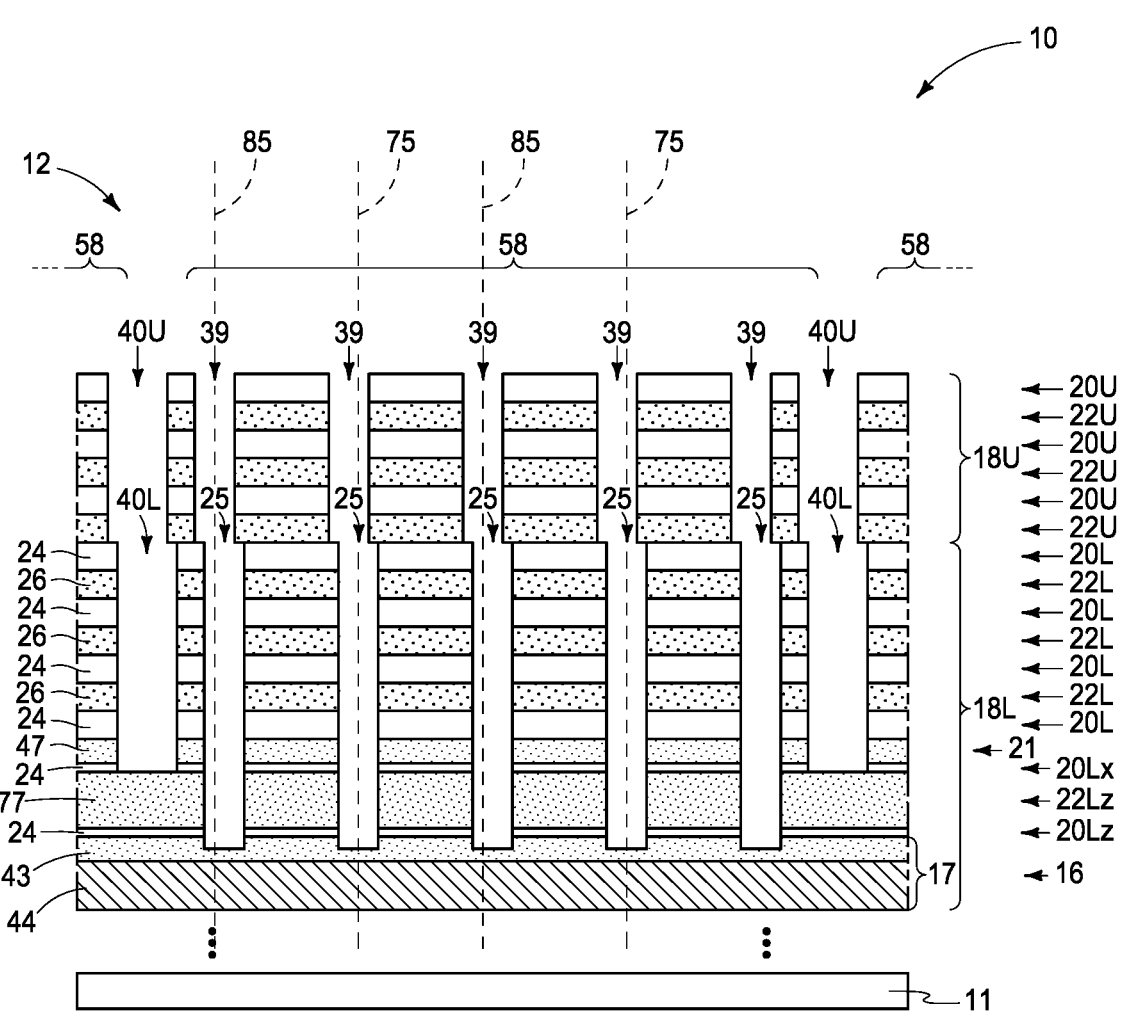
Figure 9:
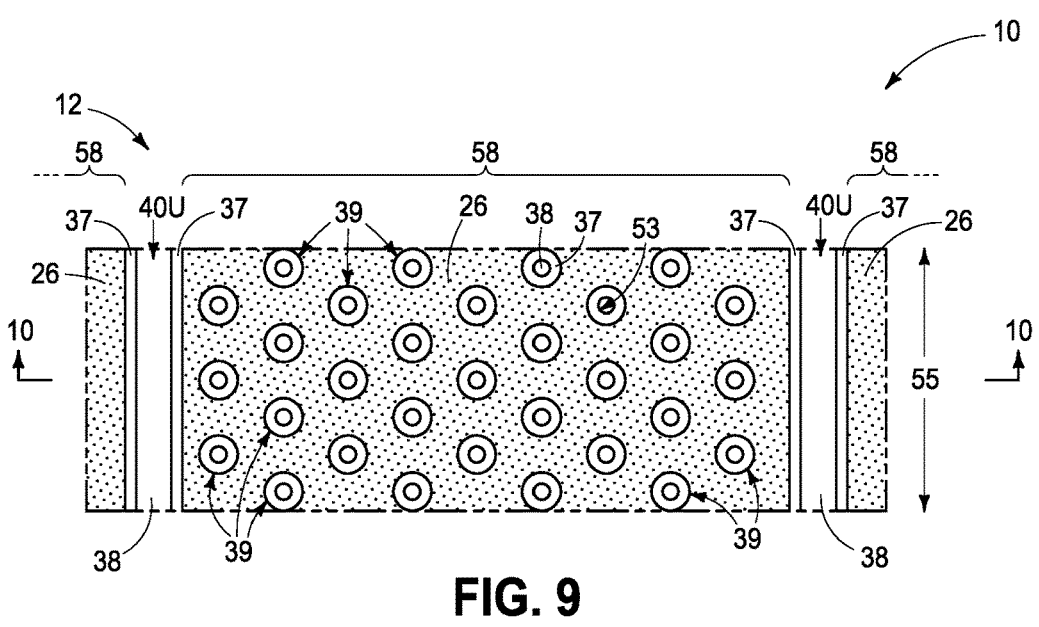
Figure 10:
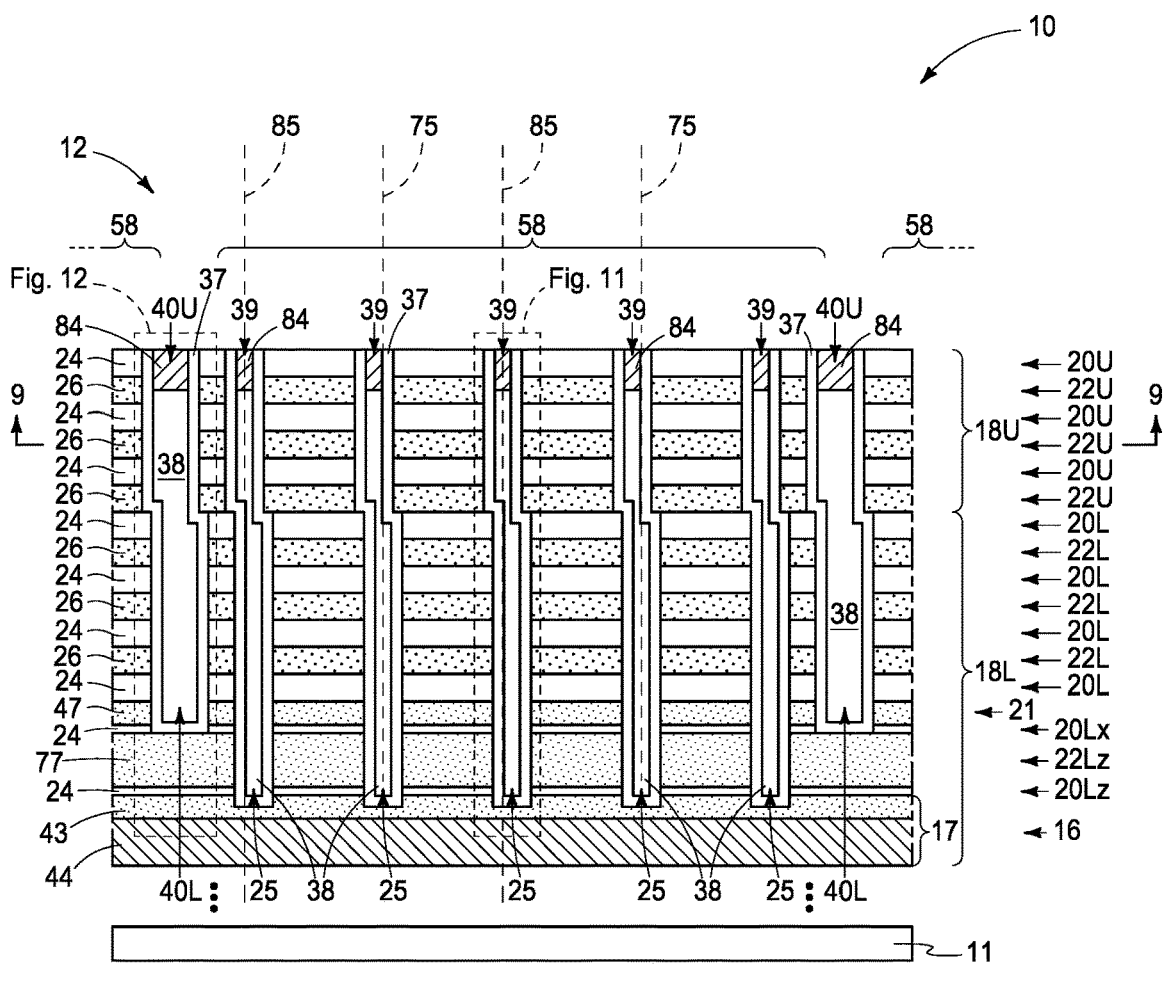

Referring to FIG. 8, sacrificial material 59 (not shown) has been removed from lower channel openings 25 and lower trenches 40L.

Some embodiments of the invention comprise forming channel material of channel-material strings in the channel openings (e.g., upper and/or lower channel openings) and forming the channel material in the horizontally-elongated trenches (e.g., upper and/or lower trenches) The channel material is removed from the horizontally-elongated trenches and the channel material of the channel-material strings is left (remains) in the channel openings. In some such embodiments, additional material of channel-material-string structures are formed in both the trenches and the channel openings and is removed from the trenches and remains in the channel openings (e.g., charge-passage material, charge-storage material, and/or charge-blocking material.

For example, FIGS. 9-12 show one embodiment where charge-blocking material 30, storage material 32, charge-passage material 34, and channel material 36 have been formed in individual upper channel openings 39 and lower channel openings 25 elevationally along insulative tiers 20U/20L and conductive tiers 22U/22L, thus forming channel-material-string structures 53 in openings 39 and 25. Materials 30, 32, 34, and 36 have also been formed in trenches 40U/40L, and when so formed ideally simultaneously when formed in openings 39/25. Transistor materials 30, 32, and 34 (e.g., memory-cell materials) and channel material 36 may be formed by, for example, deposition of respective thin layers thereof over upper stack 18U and within individual openings 39 and 25 followed by planarizing such back at least to a top surface of upper stack 18U. Materials 30, 32, 34, and 36 are collectively shown as and only designated as material 37 in FIGS. 9 and 10 due to scale.

Example thickness for each of materials 30, 32, 34, and 36 is 25 to 100 Angstroms. Punch etching may be conducted to remove materials 30, 32, and 34 from the bases of lower channel openings 25 and trenches 40L (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 39/25 and trenches 40U/40L are shown as comprising a radially/longitudinally-central solid dielectric material 38 (e.g., spin-on-dielectric, silicon dioxide, and/or silicon nitride). Alternately, and by way of example only, the radially/longitudinally-central portion within channel openings 39/25 and trenches 40U/40L may include void space(s) (not shown) and/or be devoid of solid material (not shown). A conductive plug 84 (e.g., conductively-doped polysilicon and/or metal material) may be radially inside of an uppermost portion of channel material 36 and atop dielectric material 38.

Figures 13, 14:
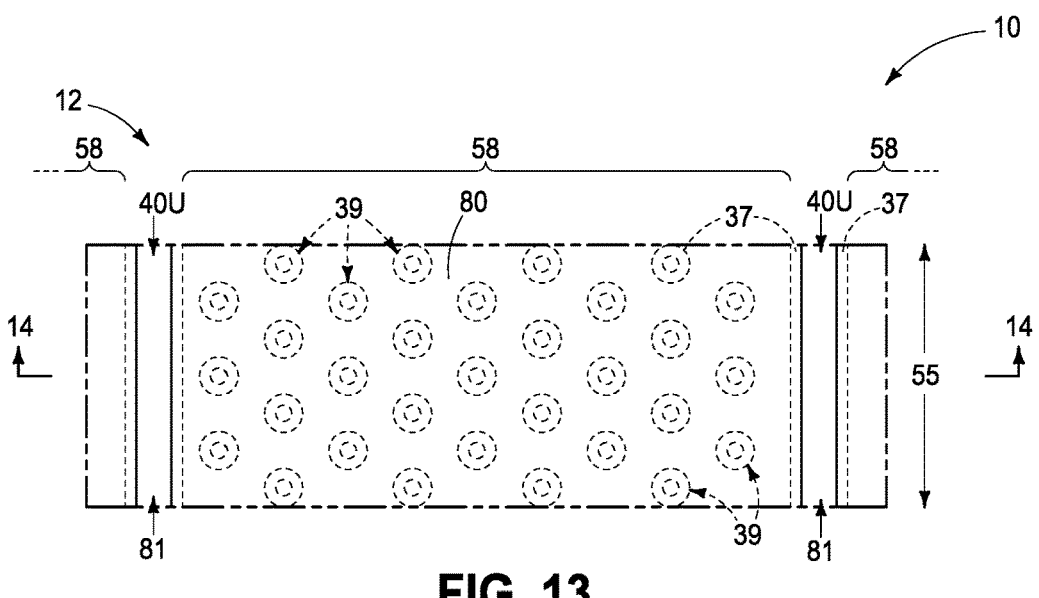

Referring to FIGS. 13 and 14, and in one embodiment, insulator material 80 (e.g., silicon dioxide or silicon nitride) has been formed atop channel material 36 that is in channel openings 39/25 and that is in trenches 40U/40L (and atop other material[s] therein when present). A mask opening 81 had been formed through insulator material 80 to individual horizontally-elongated trenches 40U/40L, with channel openings 39/25 being masked by insulator material 80. In one embodiment and as shown, mask openings 81 individually have a horizontal outline shape (FIG. 13) the same as that of individual trenches 40U/40L. A masking material 82 may be used and remain above insulator material 80 at this point of the processing, as shown. Masking material 82 may or may not be sacrificial, with photoresist being but one sacrificial example.

Figure 15:
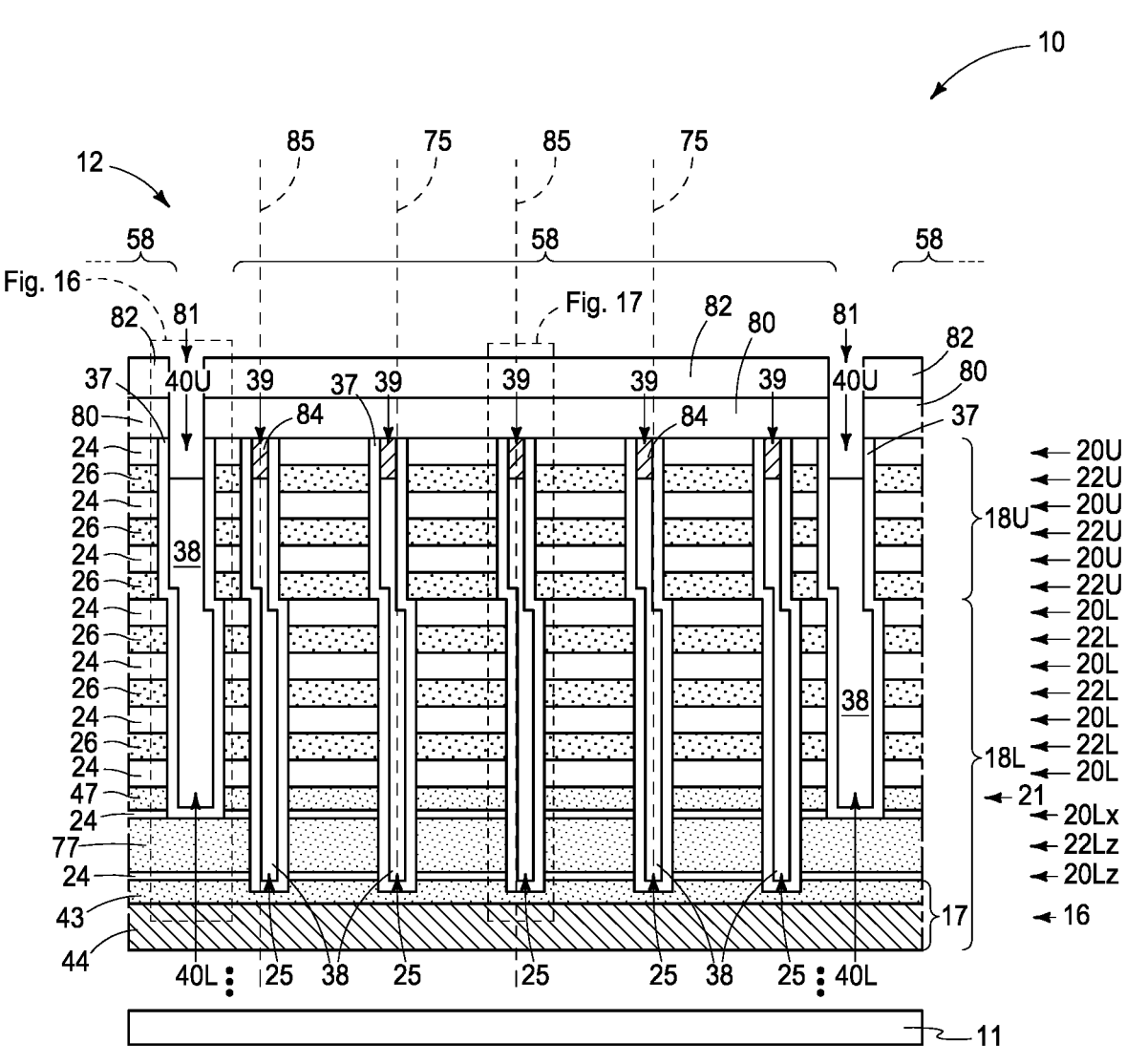
Figure 18:
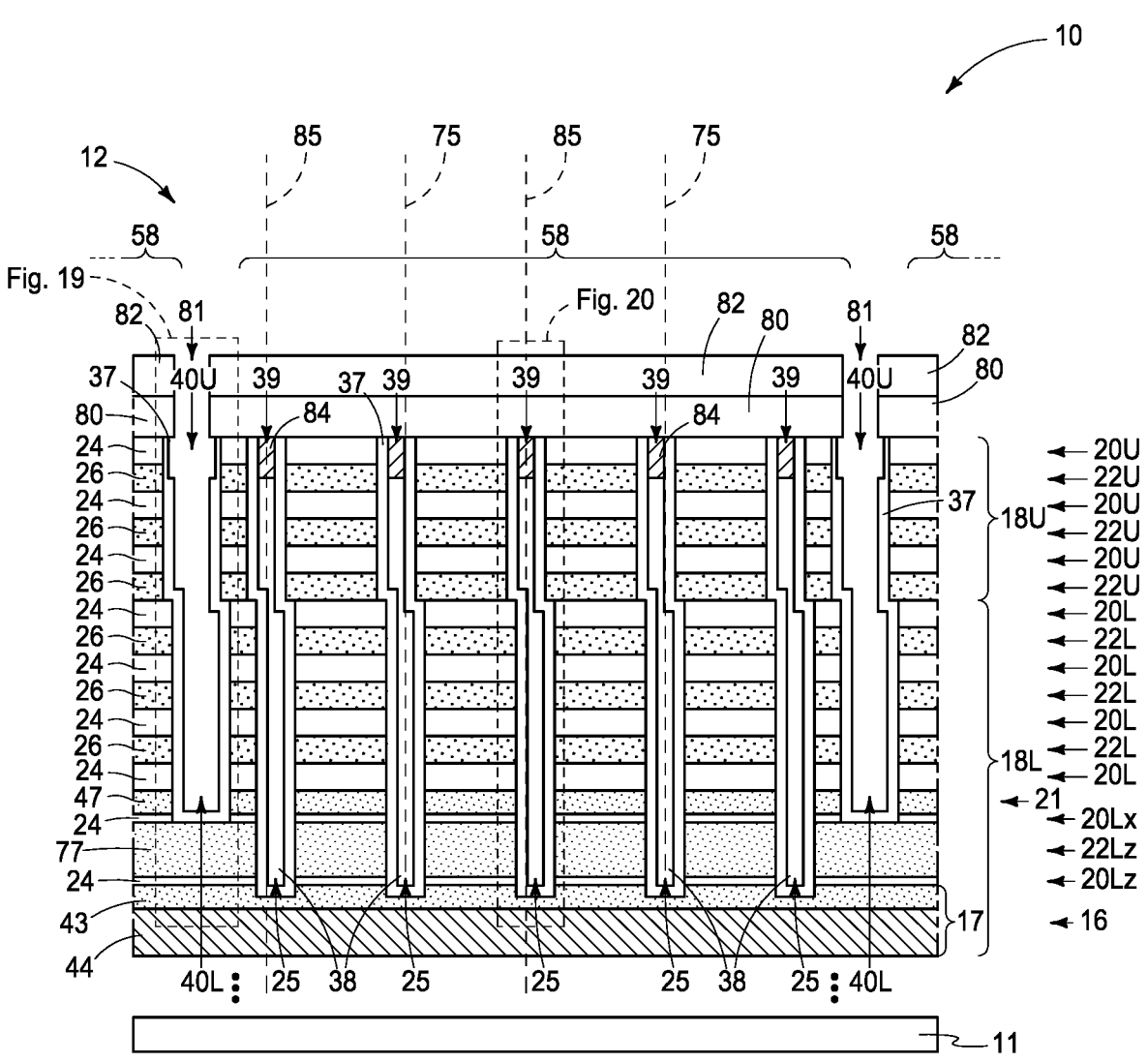
Figure 21:
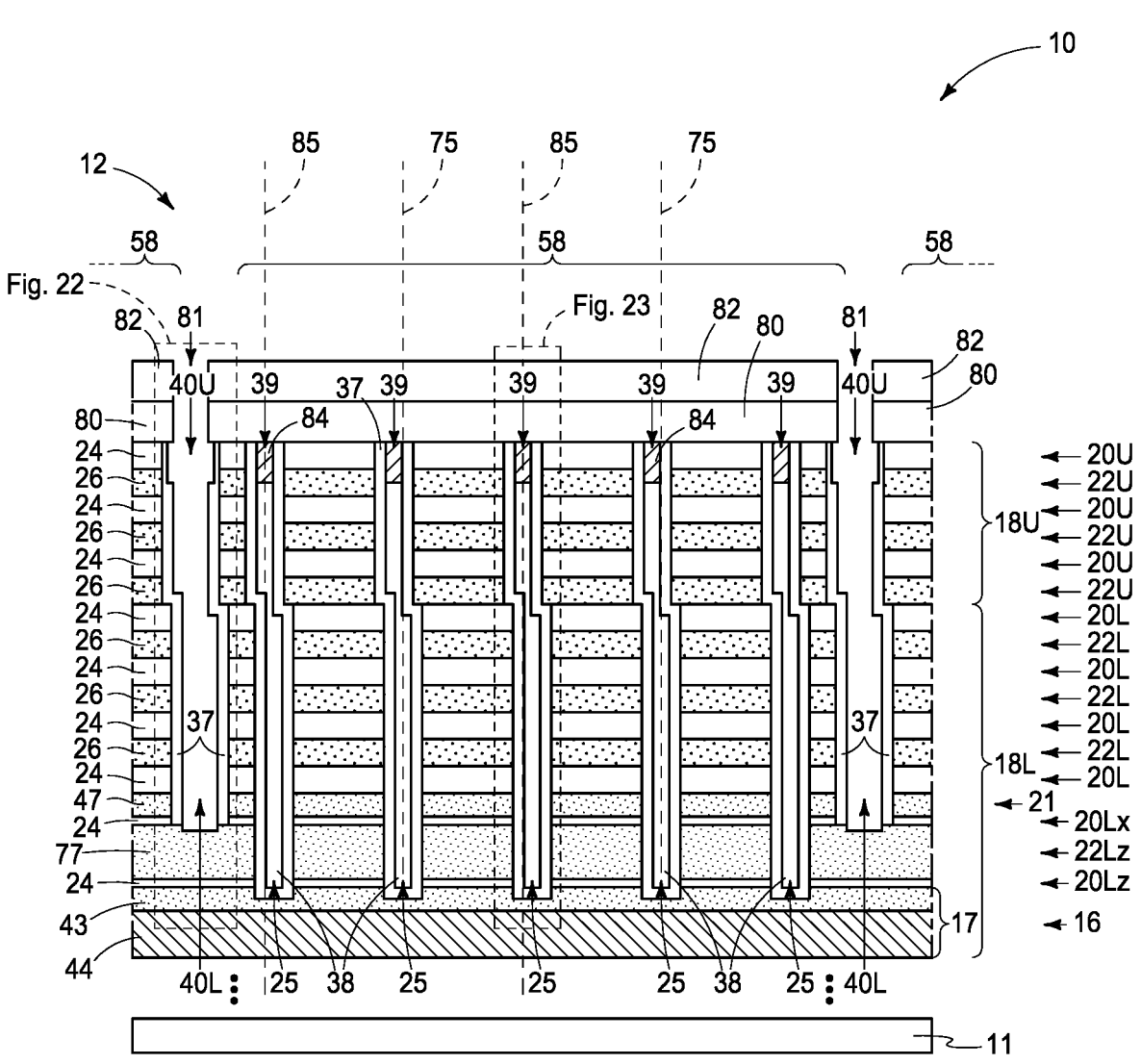

Referring to FIGS. 15-17, conductive plugs 84 (not shown) and uppermost portions of channel material 36 have been removed from trenches 40U, for example by etching. FIGS. 18-20, show example removing of dielectric material 38 from trenches 40U/40L and removing charge-passage material 34 above channel material 36 from trenches 40U. FIGS. 21-23 show using the construction of FIGS. 18-20 as a mask while etching through lowest portions of channel material 36, charge-passage material 34, charge-storage material 32, and charge-blocking material 30 to expose sacrificial material 77 of lowest first tier 22z through trenches 40U/40L. Etching may occur into material 77 as shown. Mask opening 81 in insulator material 80 (and/or in material 82 if present) may be widened in one or more of the example FIGS. 15-23 processing steps (not shown).

Figure 24:
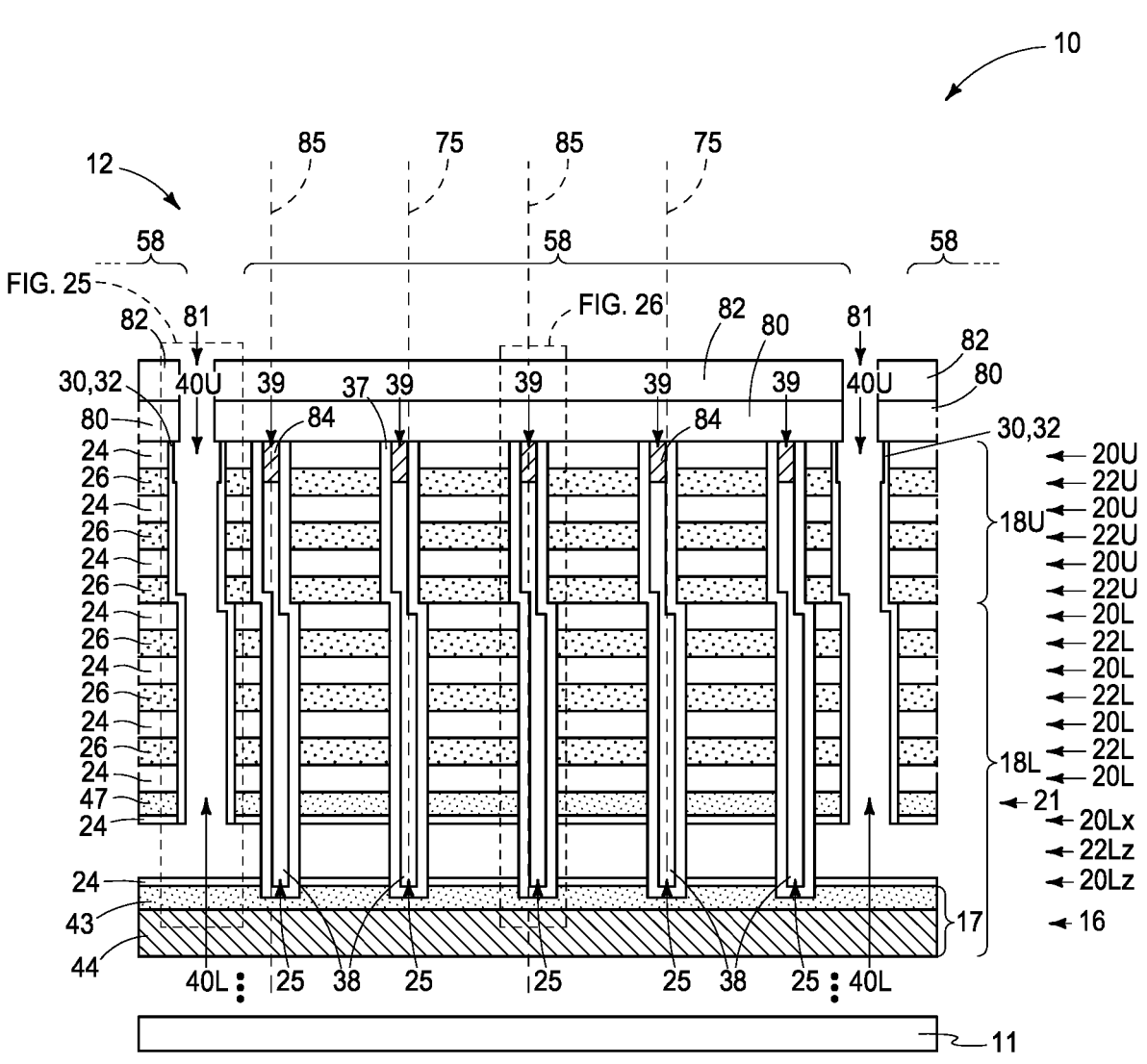

Referring to FIGS. 24-26, exposed sacrificial material 77 (not shown) has been isotropically etched (e.g., using $H_3PO_4$ where such comprises silicon nitride and using tetramethylammonium hydroxide where such comprises polysilicon) from lowest first tier 22z through trenches 40U/40L. In one example and as shown, channel material 36 that was in trenches 40U/40L (not shown) has also been etched, for example when materials 36 and 77 are of the same etchable composition (e.g., suitably doped polysilicon).

Figure 31:
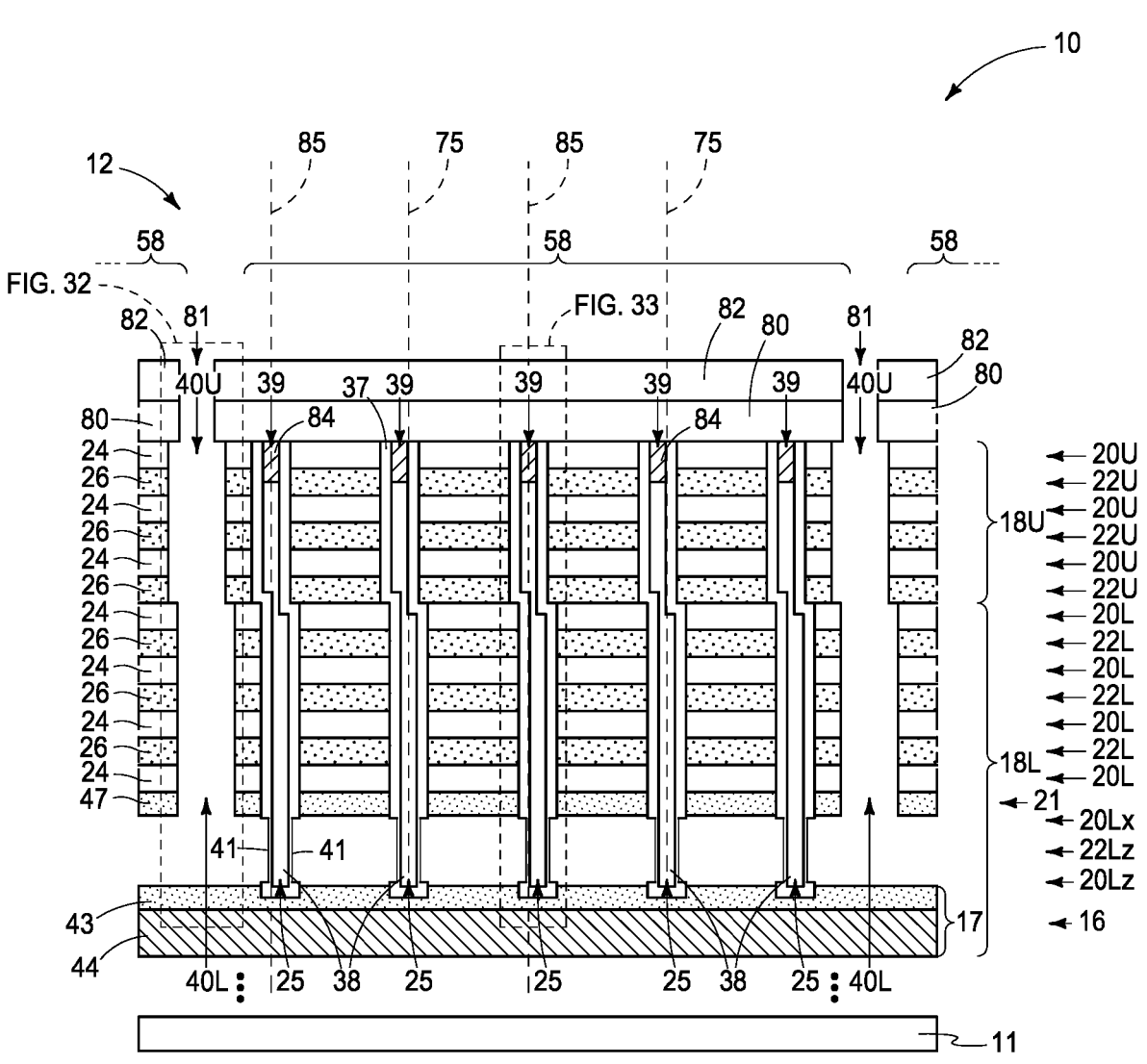

Referring to FIGS. 27 and 28, charge-passage material 34 in trenches 40U/40L (not shown) has been removed, for example by isotropic etching. Such is also shown as having reduced the thickness of material 24 of tiers 20Lx and 20Lz. Such is also shown as removing charge-blocking material 30 in tier 22Lz of channel-material-string structure 53 (for example when material 30 comprises silicon dioxide). FIGS. 29 and 30 show subsequent removal of charge-storage material 32 from trenches 40U/40L (not shown) and from channel-material-string structure 53 in tier 22Lz. FIGS. 31-33 show subsequent removal of charge-blocking material 30 from trenches 40U/40L (not shown), charge-passage material 34 from channel-material-string structure 53 in tier 22Lz, and remaining material 24 (not shown) from tiers 20Lx and 20Lz. A sidewall 41 of channel material 36 of channel-material-string structure 53 in tier 22Lz has been exposed thereby.

By way of examples only, one or more of the removed materials 36, 34, 32, and 30 may comprise silicon dioxide, silicon nitride, or multiple layers that individually comprising one of silicon dioxide or silicon nitride. Modified or different chemistries may be used for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. The artisan is capable of selecting other chemistries for etching other different materials.

Figure 34:
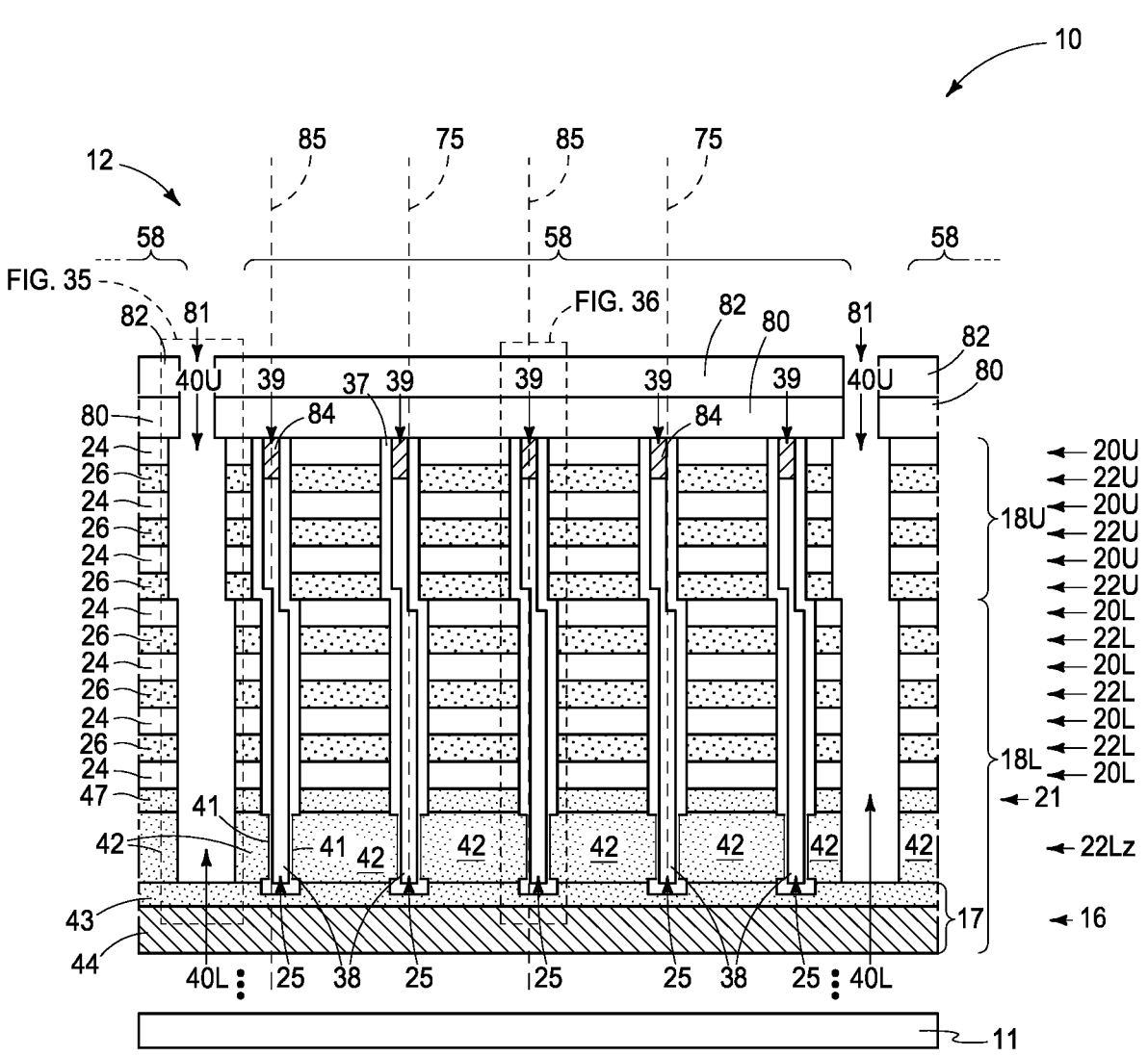
Figures 37, 38:
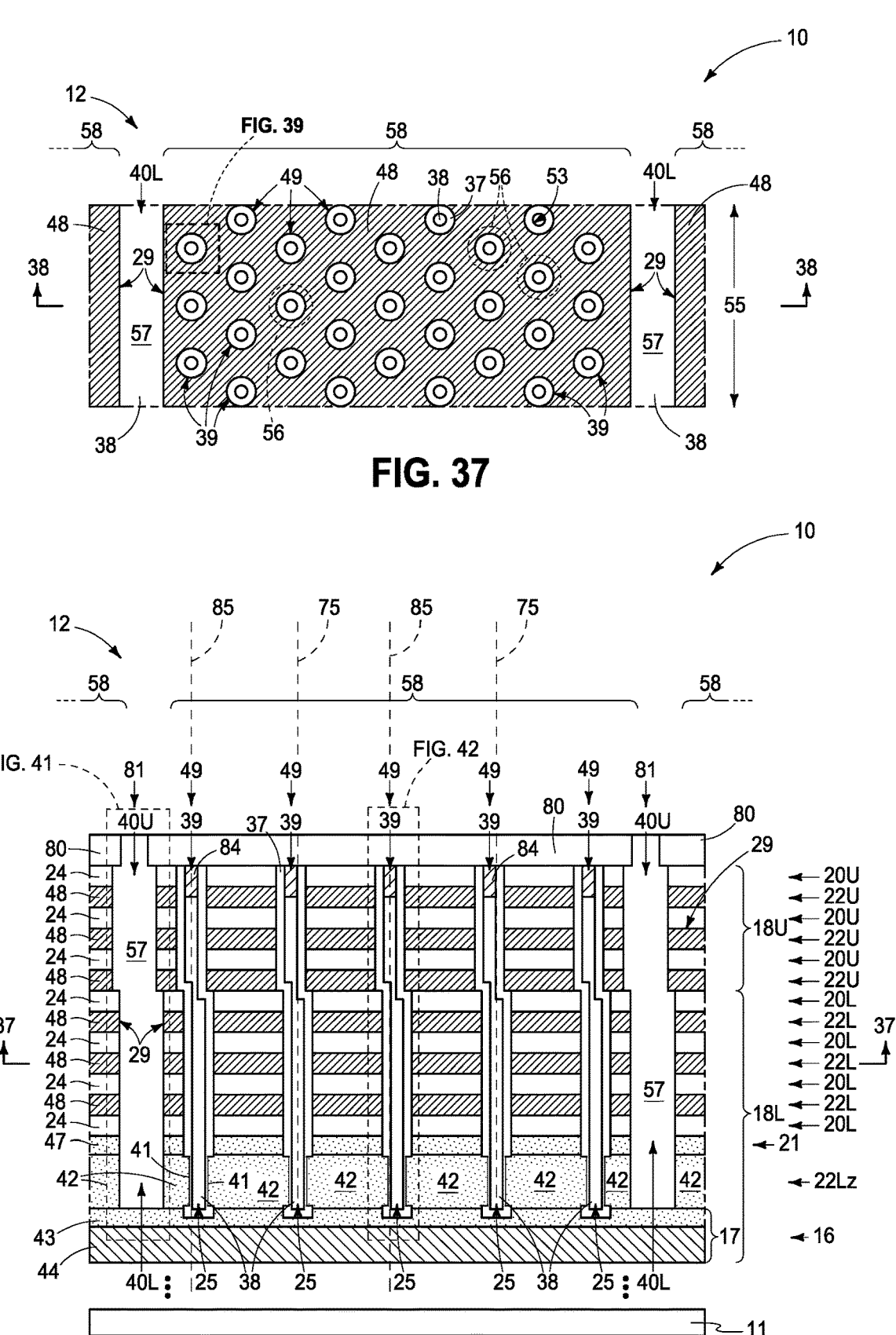
Figure 39:
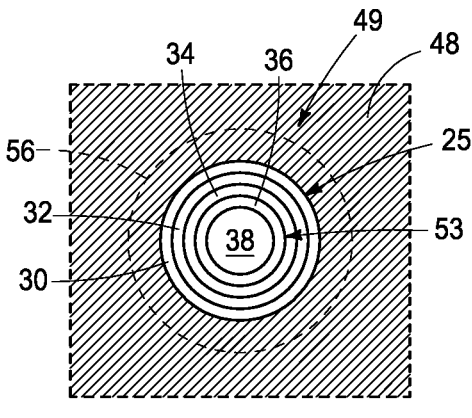
Figure 40:
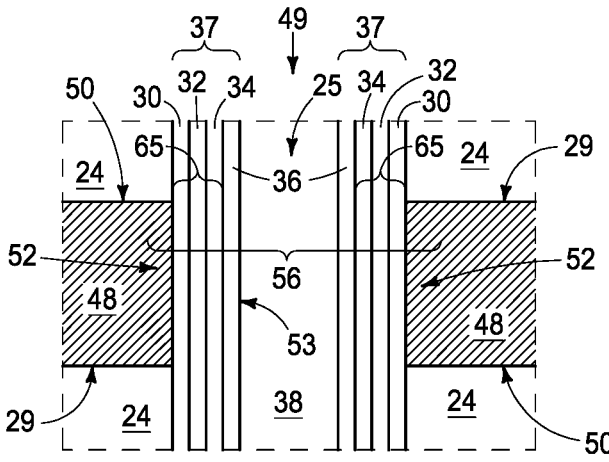

Referring to FIGS. 34-36, conductive material 42 has been formed in lowest first tier 22Lz and that directly electrically couples together channel material 36 of individual channel-material-string structure 53 and conductor material 17 of conductor tier 16, followed by removal of conductive material 42 from trenches 40U/40L.

Referring to FIGS. 37-42, material 26 (not shown) of conductive tiers 22U/22L has been removed, for example by being isotropically etched away through trenches 40U/40L ideally selectively relative to the other exposed 7506P.doc 13 materials (e.g., using liquid or vapor $H_3PO_4$ as a primary etchant where material 26 is silicon nitride and other materials comprise one or more oxides or polysilicon). Material 26 (not shown) in conductive tiers 22U/22L in the example embodiment is sacrificial and has been replaced with conducting material 48, and which has thereafter been removed from trenches 40U/40L, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 40 and some with dashed outlines in FIGS. 37-39, with transistors and/or memory cells 56 being essentially ring-like or annular in the depicted example. Alternately, transistors and/or memory cells 56 may not be completely encircling relative to individual channel openings 39/25 such that each channel opening 39/25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 40) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22U/22L is formed after forming channel openings 39/25 and/or trenches 40U/40L. Alternately, the conducting material of the conductive tiers may be formed before forming channel openings 39/25 and/or trenches 40U/40L (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide. Example channel materials 36 include appropriately-doped crystalline semiconductor material, such as one or more silicon, germanium, and so-called III/V semiconductor materials (e.g., GaAs, InP, GaP, and GaN).

Intervening material 57 has been formed in trenches 40U/40L and thereby laterally-between and longitudinally-along immediately-laterally-adjacent memory-block regions 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22U/22L from shorting relative one another in a finished circuitry construction. Example insulative materials are one or more of $SiO_2$, $Si_3N_4$, $Al_2O_3$, and undoped polysilicon. Intervening material 57 may include through array vias (not shown).

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18U/18L) comprising alternating insulative tiers (e.g., 20U/20L) and conductive tiers (e.g., 22U/22L). Channel-material-string structures (e.g., 53) of memory cells (e.g., 56) extend through the insulative tiers and the conductive tiers. The channel-material-string structures individually comprise an upper portion (e.g., 95, FIG. 42) above and joined with a lower portion (e.g., 96, FIG. 42). The upper portion comprises an average longitudinal axis (e.g., 85) and the lower portion comprising an average longitudinal axis (e.g., 75). The upper-portion average longitudinal axis is laterally offset relative to the lower-portion average longitudinal axis in a vertical cross-section (e.g., that of FIGS. 38 and 42) where the upper and lower portions join. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18U/18L) comprising alternating insulative tiers (e.g., 20U/20L) and conductive tiers (e.g., 22U/22L). Channel-material-string structures (e.g., 53) of memory cells (e.g., 56) extend through the insulative tiers and the conductive tiers. A wall (e.g., made of intervening material 57) is laterally-between and longitudinally-along immediately-laterally-adjacent of the memory blocks. The wall comprises two external jog surfaces (e.g., 90 and 92 in FIG. 41) above an uppermost of the conductive tiers (e.g., uppermost 22U when comprising upper stack 18U) in a vertical cross-section (e.g., that of FIGS. 38 and 41). In this document, a "jog surface" is characterized or defined by an abrupt change in direction [at least 15°] in comparison to external surfaces of a channel-material-string structure that are immediately-above and immediately-below the jog surface. The wall is laterally narrower immediately-directly-above the two external jog surfaces than immediately-directly-below the two external jog surfaces. Any other attribute(s) or aspect(s) as shown and/or described herein with respect to other embodiments may be used.

The above processing(s) or construction(s) may be considered as being relative to an array of components formed as or within two stacks or two decks of such components above or as part of an underlying base substrate (albeit, the two stacks/decks may each have multiple tiers). Control and/or other peripheral circuitry for operating or accessing such components within an array may also be formed anywhere as part of the finished construction, and in some embodiments may be under the array (e.g., CMOS underarray). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time. Alternately, aspects of the processing(s) or construction(s) may be with respect to a single stack or single deck above or part of an underlying base substrate.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers. The stack comprises laterally-spaced memory-block regions that have horizontally-elongated trenches there-between. Channel openings extend through the first tiers and the second tiers in the memory-block regions. Channel material of channel-material strings is formed in the channel openings and the channel material is formed in the horizontally-elongated trenches. The channel material is removed from the horizontally-elongated trenches and the channel material of the channel-material strings is left in the channel openings. After removing the channel material from the horizontally-elongated trenches, intervening material is formed in the horizontally-elongated trenches laterally-between and longitudinally-along immediately-laterally-adjacent of the memory-block regions.

In some embodiments, a method used in forming a memory array comprising strings of memory cells comprises forming an upper stack directly above a lower stack. The lower stack comprises vertically-alternating lower first tiers and lower second tiers. The upper stack comprises vertically-alternating upper first tiers and upper second tiers. The upper and lower stacks collectively comprise laterally-spaced memory-block regions. The method includes simultaneously forming (a) and (b), where (a): horizontally-elongated upper trenches into the upper stack laterally-between immediately-laterally-adjacent of the memory-block regions; and (b): upper channel openings into the upper stack laterally-between the horizontally-elongated upper trenches. Channel-material strings are formed in the upper channel openings. Intervening material is formed in the horizontally-elongated upper trenches laterally-between and longitudinally-along the immediately-laterally-adjacent memory-block regions.

In some embodiments, a memory array comprising strings of memory cells comprises laterally-spaced memory blocks individually comprising a vertical stack comprising alternating insulative tiers and conductive tiers. Channel-material-string structures of memory cells extend through the insulative tiers and the conductive tiers. The channel-material-string structures individually comprise an upper portion above and joined with a lower portion. The upper portion comprises an average longitudinal axis and the lower portion comprises an average longitudinal axis. The upper-portion average longitudinal axis is laterally offset relative to the lower-portion average longitudinal axis in a vertical cross-section where the upper and lower portions join.

In some embodiments, a memory array comprising strings of memory cells comprises laterally-spaced memory blocks individually comprising a vertical stack comprising alternating insulative tiers and conductive tiers. Channel-material-string structures of memory cells extend through the insulative tiers and the conductive tiers. A wall is laterally-between and longitudinally-along immediately-laterally-adjacent of the memory blocks. The wall comprises two external jog surfaces above an uppermost of the conductive tiers in a vertical cross-section. The wall is laterally narrower immediately-directly-above the two external jog surfaces than immediately-directly-below the two external jog surfaces.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
    laterally-spaced memory blocks individually comprising a vertical stack comprising alternating insulative tiers and conductive tiers, channel-material-string structures of memory cells extending through the insulative tiers and the conductive tiers; and
    the channel-material-string structures individually comprising an upper portion above and joined with a lower portion, the upper portion comprising an average longitudinal axis and the lower portion comprising an average longitudinal axis, the upper-portion average longitudinal axis being laterally offset relative to the lower-portion average longitudinal axis in a vertical cross-section where the upper and lower portions join, channel material of the channel-material-string structures comprising two external jog surfaces in a vertical cross-section, one of the two external jog surfaces being in one of the insulative tiers, another of the two external jog surfaces being in one of the conductive tiers.

2. The memory array of claim 1 wherein the upper-portion average longitudinal axis and the lower-portion average longitudinal axis are parallel relative one another.

3. The memory array of claim 1 comprising NAND.

4. A memory array comprising strings of memory cells, comprising:
    laterally-spaced memory blocks individually comprising a vertical stack comprising alternating insulative tiers and conductive tiers, channel-material-string structures of memory cells extending through the insulative tiers and the conductive tiers;
    the channel-material-string structures individually comprising an upper portion above and joined with a lower portion, the upper portion comprising an average longitudinal axis and the lower portion comprising an average longitudinal axis, the upper-portion average longitudinal axis being laterally offset relative to the lower-portion average longitudinal axis in a vertical cross-section where the upper and lower portions join; and
    a conductor tier comprising conductor material directly below the vertical stack and laterally-between the laterally-spaced memory blocks, conducting material in a lowest of the conductive tiers being directly against a sidewall of the channel material of individual of the channel-material-string structures and directly against the conductor material of the conductor tier.

5. The memory array of claim 4 wherein a lowest surface of the channel material of the channel-material-string constructions is not directly against the conductor material of the conductor tier.

6. A memory array comprising strings of memory cells, comprising:
    laterally-spaced memory blocks individually comprising a vertical stack comprising alternating insulative tiers and conductive tiers, channel-material-string structures of memory cells extending through the insulative tiers and the conductive tiers; and
    a wall laterally-between and longitudinally-along immediately-laterally-adjacent of the memory blocks, the wall comprising two external jog surfaces above an uppermost of the conductive tiers in a vertical cross-section, the wall being laterally narrower immediately-directly-above the two external jog surfaces than immediately-directly-below the two external jog surfaces.

7. The memory array of claim 6 comprising a conductor tier comprising conductor material directly below the vertical stack and laterally-between the laterally-spaced memory blocks, conducting material in a lowest of the conductive tiers being directly against a sidewall of the channel material of individual of the channel-material-string structures and directly against the conductor material of the conductor tier.

8. The memory array of claim 7 wherein a lowest surface of the channel material of the channel-material-string constructions is not directly against the conductor material of the conductor tier.

9. The memory array of claim 6 comprising NAND.

10. The memory array of claim 6 wherein the wall has external sidewall surfaces that are straight through multiple of the insulative tiers and multiple of the conductive tiers in the vertical cross-section below the two external jog surfaces.

11. A memory array comprising strings of memory cells, comprising:
    laterally-spaced memory blocks individually comprising a vertical stack comprising alternating insulative tiers and conductive tiers, channel-material-string structures of memory cells extending through the insulative tiers and the conductive tiers; and
    the channel-material-string structures individually comprising an upper portion above and joined with a lower portion, the upper portion comprising an average longitudinal axis and the lower portion comprising an average longitudinal axis, the upper-portion average longitudinal axis being laterally offset relative to the lower-portion average longitudinal axis in a vertical cross-section where the upper and lower portions join, the channel-material-string structures comprising charge-blocking material having two external jog surfaces in a vertical cross-section, one of the two external jog surfaces being in one of the insulative tiers, another of the two external jog surfaces being in one of the conductive tiers.

12. A memory array comprising strings of memory cells, comprising:

laterally-spaced memory blocks individually comprising a vertical stack comprising alternating insulative tiers and conductive tiers, channel-material-string structures of memory cells extending through the insulative tiers and the conductive tiers; and the channel-material-string structures individually comprising an upper portion above and joined with a lower portion, the upper portion comprising an average longitudinal axis and the lower portion comprising an average longitudinal axis, the upper-portion average longitudinal axis being laterally offset relative to the lower-portion average longitudinal axis in a vertical cross-section where the upper and lower portions join, the channel-material-string structures comprising storage material having two external jog surfaces in a vertical cross-section, one of the two external jog surfaces being in one of the insulative tiers, another of the two external jog surfaces being in one of the conductive tiers.

13. A memory array comprising strings of memory cells, comprising:

laterally-spaced memory blocks individually comprising a vertical stack comprising alternating insulative tiers and conductive tiers, channel-material-string structures of memory cells extending through the insulative tiers and the conductive tiers; and the channel-material-string structures individually comprising an upper portion above and joined with a lower portion, the upper portion comprising an average longitudinal axis and the lower portion comprising an average longitudinal axis, the upper-portion average longitudinal axis being laterally offset relative to the lower-portion average longitudinal axis in a vertical cross-section where the upper and lower portions join, the channel-material-string structures comprising charge-passage material having two external jog surfaces in a vertical cross-section, one of the two external jog surfaces being in one of the insulative tiers, another of the two external jog surfaces being in one of the conductive tiers.

* * * * *